United States Patent
Lim et al.

(10) Patent No.: US 12,016,201 B2
(45) Date of Patent: Jun. 18, 2024

(54) DISPLAY DEVICE

(71) Applicant: Samsung Display Co., Ltd., Yongin-si (KR)

(72) Inventors: Jae Ik Lim, Hwaseong-si (KR); Chaun Gi Choi, Suwon-si (KR); Sang Woo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 87 days.

(21) Appl. No.: 17/310,708

(22) PCT Filed: Dec. 31, 2019

(86) PCT No.: PCT/KR2019/018818
§ 371 (c)(1),
(2) Date: Aug. 18, 2021

(87) PCT Pub. No.: WO2020/171370
PCT Pub. Date: Aug. 27, 2020

(65) Prior Publication Data
US 2022/0165994 A1    May 26, 2022

(30) Foreign Application Priority Data
Feb. 19, 2019    (KR) .................. 10-2019-0019338

(51) Int. Cl.
*G06F 3/044*    (2006.01)
*H01L 27/32*    (2006.01)
(Continued)

(52) U.S. Cl.
CPC ......... *H10K 50/858* (2023.02); *G06F 3/0445* (2019.05); *H10K 59/12* (2023.02); *H10K 59/40* (2023.02)

(58) Field of Classification Search
CPC ...... G06F 3/0412; G06F 3/044; G06F 3/0445; H10K 50/858; H10K 59/12; H10K 59/40;
(Continued)

(56) References Cited

U.S. PATENT DOCUMENTS 9,184,414 B2    11/2015    Naraoka et al.
9,209,230 B2    12/2015    Shim et al.
(Continued)

FOREIGN PATENT DOCUMENTS

CN    102742352 A    10/2012
CN    103885106 A    6/2014
(Continued)

OTHER PUBLICATIONS

Chinese Office Action dated Apr. 24, 2024, issued in corresponding Chinese Patent Application No. 201980092383.0, 10 pages.

*Primary Examiner* — Md Saiful A Siddiqui
(74) *Attorney, Agent, or Firm* — Lewis Roca Rothgerber Christie LLP

(57) ABSTRACT

A display device includes: a substrate; a light-emitting element on the substrate; a planarization layer on the light-emitting element; a first refractive index layer on the planarization layer and including a total reflection inclination surface totally reflecting light emitted from the light-emitting element in a front direction and a refraction inclination surface refracting light emitted from the light-emitting element in the front direction; a second refractive index layer on the first refractive index layer to be in contact with the refraction inclination surface and having a smaller refractive index than a refractive index of the first refractive index layer; and a third refractive index layer on the first refractive index layer and the second refractive index layer to be in contact with the total reflection inclination surface and
(Continued)

having a larger refractive index than the refractive index of the first refractive index layer.

18 Claims, 22 Drawing Sheets

(51) Int. Cl.
*H01L 51/52* (2006.01)
*H10K 50/858* (2023.01)
*H10K 59/12* (2023.01)
*H10K 59/40* (2023.01)

(58) Field of Classification Search
CPC ... H10K 50/856; H10K 59/352; H10K 59/353
See application file for complete search history.

(56) References Cited

U.S. PATENT DOCUMENTS

| | | | |
|---|---|---|---|
| 9,507,059 | B2 | 11/2016 | Shim et al. |
| 9,933,587 | B2 | 4/2018 | Modavis et al. |
| 10,205,128 | B2 | 2/2019 | Yang et al. |
| 10,483,335 | B2 | 11/2019 | Bang et al. |
| 10,644,265 | B2 | 5/2020 | Noh et al. |
| 10,971,702 | B2 | 4/2021 | Kim et al. |
| 2004/0160165 | A1 | 8/2004 | Yamauchi |
| 2012/0262943 | A1 | 10/2012 | Urabe et al. |
| 2012/0286258 | A1* | 11/2012 | Naraoka ............... C09B 1/00 257/40 |
| 2015/0123911 | A1* | 5/2015 | Poliakov ............ G06F 3/0412 29/829 |
| 2015/0188091 | A1 | 7/2015 | Kudo et al. |
| 2017/0373277 | A1* | 12/2017 | Noh .................. H10K 50/852 |
| 2018/0138458 | A1* | 5/2018 | Tokuda ............. H10K 50/844 |
| 2018/0190740 | A1 | 7/2018 | Bang et al. |
| 2019/0013495 | A1 | 1/2019 | Kim et al. |
| 2020/0035769 | A1* | 1/2020 | Youn .................... G06F 3/011 |
| 2021/0184179 | A1 | 6/2021 | Kim et al. |

FOREIGN PATENT DOCUMENTS

| | | |
|---|---|---|
| CN | 105870361 A | 8/2016 |
| CN | 107546333 A | 1/2018 |
| CN | 108269833 A | 7/2018 |
| CN | 109216581 A | 7/2018 |
| JP | 2007-248484 A | 9/2007 |
| KR | 10-2004-0054543 A | 6/2004 |
| KR | 10-2013-0071414 A | 6/2013 |
| KR | 10-2017-0113821 A | 10/2017 |
| KR | 10-2017-0136687 A | 12/2017 |
| KR | 10-2018-0078657 A | 7/2018 |
| WO | 2013/065170 A1 | 5/2013 |

* cited by examiner

DISPLAY DEVICE

CROSS-REFERENCE TO RELATED APPLICATIONS

This application is a U.S. National Phase Patent Application of International Patent Application Number PCT/KR2019/018818, filed on Dec. 31, 2019, which claims priority to Korean Patent Application Number 10-2019-0019338, filed on Feb. 19, 2019, the entire content of all of which is incorporated herein by reference.

FIELD

Aspects of some embodiments of the present invention relate to a display device.

BACKGROUND

An emissive display device may include two electrodes and an emission layer interposed therebetween, and in which electrons injected from one electrode and holes injected from another electrode are combined in the emission layer to generate excitons. The generated excitons are changed to a ground state from an excited state, releasing energy to emit light.

The emissive display device may include a plurality of pixels including a light emitting diode (LED) as a self-light emitting element, and each pixel includes a plurality of transistors and at least one capacitor for driving the light emitting diode (LED). A plurality of transistors basically include a switching transistor and a driving transistor.

A significant amount of light generated by the light emitting diode (LED) may be lost while passing through several layers, resulting in a relatively low light emission region efficiency. To solve this problem, there are attempts such as forming a lens. However, it may be difficult to control the curvature of the lens, and the distance between the lens and the light emitting diode (LED) may be relatively long, so there is a limit to improving the light emission region efficiency.

The above information disclosed in this Background section is only for enhancement of understanding of the background and therefore the information discussed in this Background section does not necessarily constitute prior art.

SUMMARY

Aspects of some embodiments of the present invention relate to a display device. For example, aspects of some embodiments of the present invention relate to a display device of which a pixel includes a light-emitting element.

Aspects of some embodiments of the present invention may include a display device capable of improving light emission efficiency of light generated from a light-emitting element.

A display device according to some embodiments of the present invention includes: a substrate; a light-emitting element on the substrate; a planarization layer on the light-emitting element; a first refractive index layer on the planarization layer and including a total reflection inclination surface totally reflecting light emitted from the light-emitting element in a front direction and a refraction inclination surface refracting light emitted from the light-emitting element in the front direction; a second refractive index layer on the first refractive index layer to be in contact with the refraction inclination surface and having a smaller refractive index than a refractive index of the first refractive index layer; and a third refractive index layer on the first refractive index layer and the second refractive index layer to be in contact with the total reflection inclination surface and having a larger refractive index than the refractive index of the first refractive index layer.

According to some embodiments, a refractive index difference between the first refractive index layer and the second refractive index layer may be 0.05 or more.

According to some embodiments, a refractive index difference between the first refractive index layer and the third refractive index layer may be 0.05 or more.

According to some embodiments, the thickness of the second refractive index layer may be the thickness of the first refractive index layer or more.

According to some embodiments, a refraction inclination angle formed by the refraction inclination surface with the upper surface of the substrate may be less than 90 degrees and 50 degrees or more.

According to some embodiments, the first refractive index layer may be in a form of a ring shape surrounding a light-emitting region of the light-emitting element on a plane.

According to some embodiments, the total reflection inclination surface may be an inner side surface of the ring-shaped first refractive index layer.

According to some embodiments, the refraction inclination surface may be an outer side surface of the ring-shaped first refractive index layer.

A display device according to some embodiments of the present invention includes: a substrate; a light-emitting element on the substrate; a planarization layer on the light-emitting element; a first refractive index layer on the planarization layer and including a refraction inclination surface refracting light emitted from the light-emitting element in a front direction; a second refractive index layer on the first refractive index layer to be in contact with the refraction inclination surface and including a total reflection inclination surface totally reflecting light emitted from the light-emitting element in the front direction and having a larger refractive index than a refractive index of the first refractive index layer; and a third refractive index layer on the second refractive index layer to be in contact with the total reflection inclination surface and having a larger refractive index than a refractive index of the second refractive index layer.

According to some embodiments, a refractive index difference between the first refractive index layer and the second refractive index layer may be 0.05 or more.

According to some embodiments, a refractive index difference between the second refractive index layer and the third refractive index layer may be 0.05 or more.

According to some embodiments, a refraction inclination angle of the refraction inclination surface formed by the upper surface of the substrate may be less than a total reflection inclination angle of the total reflection inclination surface formed by the upper surface of the substrate.

According to some embodiments, the thickness of the second refractive index layer may be the thickness of the first refractive index layer or more.

According to some embodiments, the display device may further include: a first touch electrode between the planarization layer and the first refractive index layer; and a second touch electrode between the first refractive index layer and the second refractive index layer.

According to some embodiments, the display device may further include: a touch insulating layer between the planarization layer and the first refractive index layer; a first touch electrode between the planarization layer and the touch insulating layer; and a second touch electrode between the touch insulating layer and the first refractive index layer.

A display device according to some embodiments of the present invention includes: a substrate; a light-emitting element on the substrate; a total reflection inclination surface total reflecting light emitted from the light-emitting element in a front direction; and a refraction inclination surface refracting light emitted from the light-emitting element in the front direction, wherein a region wherein light is emitted in the front direction in one pixel includes a front light region corresponding a light emission region of the light-emitting element, a total reflection light region corresponding to the total reflection inclination surface, and a refraction light region corresponding to the refraction inclination surface.

According to some embodiments, the total reflection inclination surface may be an interface between a first refractive index layer having a first refractive index and a third refractive index layer having a third refractive index that is larger than a first refractive index, and the refraction inclination surface may be an interface between the first refractive index layer and a second refractive index layer having a second refractive index that is smaller than the first refractive index.

According to some embodiments, the first refractive index layer may have a ring shape surrounding the light emission region of the light-emitting element on a plane.

According to some embodiments, the refraction inclination surface may be an interface between a first refractive index layer having a first refractive index and a second refractive index layer having a second refractive index that is larger than the first refractive index, and the total reflection inclination surface may be an interface between the second refractive index layer and a third refractive index layer having a third refractive index that is larger than the second refractive index.

According to some embodiments, a refraction inclination angle of the refraction inclination surface formed by the upper surface of the substrate may be less than a total reflection inclination angle of the total reflection inclination surface formed by the upper surface of the substrate.

According to some embodiments, the light emission region efficiency of the display device may be improved by allowing the light generated from the light-emitting element to be emitted to the front through the total reflection and the refraction of the refractive index layer.

DETAILED DESCRIPTION

Figure 1:
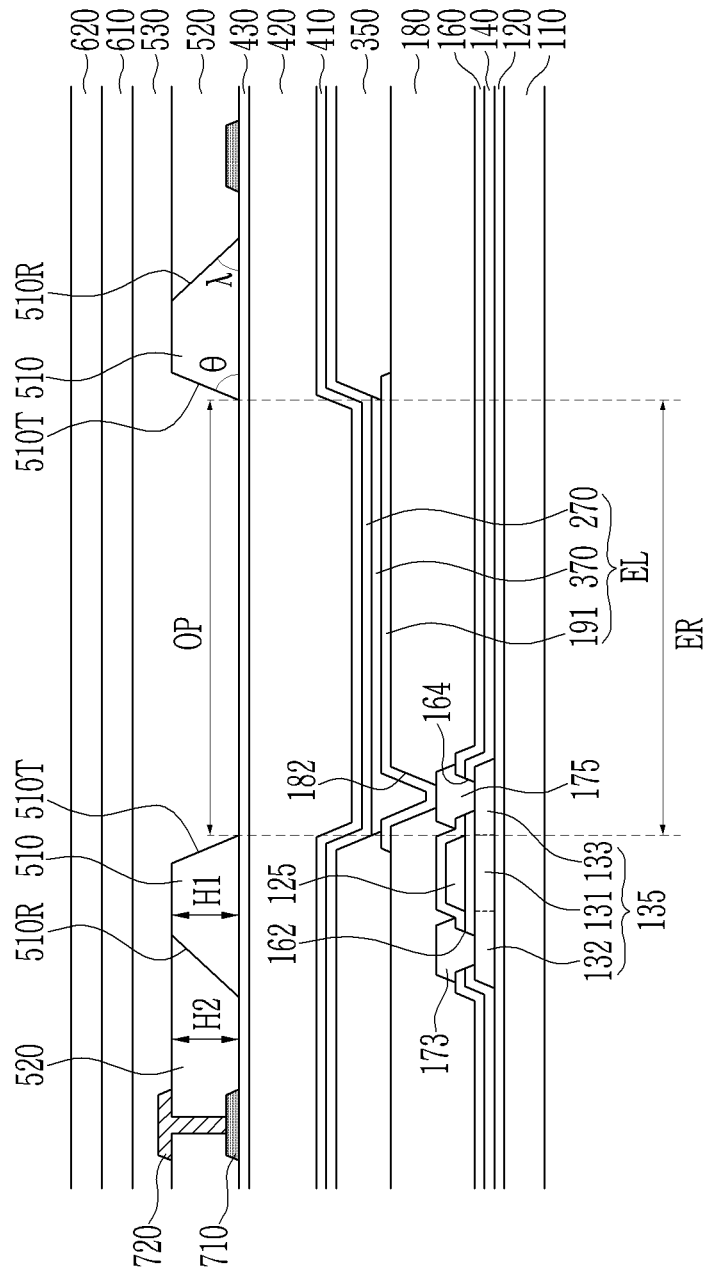
FIG. 1 is a cross-sectional view showing a display device according to some embodiments of the present invention.

Aspects of some embodiments of the present invention will be described more fully hereinafter with reference to the accompanying drawings, in which aspects of some embodiments of the invention are shown. As those skilled in the art would realize, the described embodiments may be modified in various different ways, all without departing from the spirit or scope of embodiments according to the present invention.

Further, in the embodiments, like reference numerals designate like elements throughout the specification representatively in a first embodiment, and only elements other than those of the first embodiment will be described in subsequent embodiments.

In order to elucidate the present invention, parts that are not related to the description will be omitted. Like reference numerals designate like elements throughout the specification.

Further, the size and thickness of each of elements that are displayed in the drawings are arbitrarily described for better understanding and ease of description, and the present invention is not limited by the described size and thickness. In the drawings, the thickness of layers, films, panels, regions, etc., are exaggerated for clarity. In the drawings, for better understanding and ease of description, thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a flat surface" means when an object portion is viewed from above, and the phrase "on a cross-section" means when a cross-section taken by vertically cutting an object portion is viewed from the side.

First, a display device according to some embodiments of the present invention is described with reference to FIG. 1.

FIG. 1 is a cross-sectional view of a display device according to some embodiments of the present invention.

Referring to FIG. 1, a display device according to some embodiments includes a substrate 110, a light-emitting element EL disposed on the substrate 110, a planarization layer 420 disposed on the light-emitting element EL, and first to third refractive index layers 510, 520, and 530 disposed on the planarization layer 420.

The substrate 110 may be an insulating substrate made of glass, quartz, ceramic, or plastic. Alternatively, the substrate 110 may be a metal substrate made of stainless steel or the like. The substrate 110 may have flexibility, and accordingly, the display device may have flexibility.

A buffer layer 120 may be disposed on the substrate 110. The buffer layer 120 may be formed of a single layer of silicon nitride (SiNx) or a multilayer structure in which a silicon nitride (SiNx) and a silicon oxide (SiOx) are stacked. The buffer layer 120 may simultaneously flatten the surface of the substrate 110 while preventing or reducing penetration of unnecessary components such as impurities or moisture. According to some embodiments, the buffer layer 120 may be omitted. The buffer layer 120 may be formed to cover the entire upper surface of the substrate 110.

A semiconductor layer 135 is disposed on the buffer layer 120. The semiconductor layer 135 may include a semiconductor material such as amorphous silicon, polysilicon, or an oxide semiconductor. In addition, the semiconductor layer 135 includes a channel 131 to which an impurity is not doped, and contact doping regions 132 and 133 that are disposed on respective sides of the channel 131 where the impurity is not doped. The contact doping regions 132 and 133 are a source region 132 and a drain region 133. Here, the type of the impurity may vary depending on the type of the transistor.

A gate insulating layer 140 is disposed on the semiconductor layer 135. The gate insulating layer 140 may include an inorganic insulating material such as a silicon nitride (SiNx), a silicon oxide (SiOx), and a silicon oxynitride (SiON).

A gate electrode 125 is disposed on the gate insulating layer 140. The gate electrode 125 may overlap at least part of the semiconductor layer 135, and particularly, the channel 131. The overlapping means overlapping in the vertical direction on the cross-section and positioning he same region on a plane.

An interlayer insulating layer 160 is disposed on the gate electrode 125 and the gate insulating layer 140. The interlayer insulating layer 160 may include an inorganic insulating material or an organic insulating material.

The gate insulating layer 140 and the interlayer insulating layer 160 may include contact holes 162 and 164 overlapping at least a portion of the semiconductor layer 135. The contact holes 162 and 164 may be disposed on the contact doping regions 132 and 133 of the semiconductor layer 135.

A source electrode 173 and a drain electrode 175 are disposed on the interlayer insulating layer 160. The source electrode 173 may be connected to the source region 132 of the semiconductor layer 135 through the contact hole 162, and the drain electrode 175 may be connected to the drain region 133 of the semiconductor layer 135 through the contact hole 164.

The semiconductor layer 135, the gate electrode 125, the source electrode 173, and the drain electrode 175 may form a single transistor. The configuration of the transistor is not limited to the above-described example, and may be variously changed into a well-known configuration. The emissive display device may include a switching transistor and a driving transistor, and the above-described transistor may be the driving transistor.

A protection layer 180 is disposed on the transistor and the interlayer insulating layer 160. The protection layer 180 may play a role of flattening and removing steps in order to increase the luminous efficiency of the light-emitting element EL to be formed thereon. In addition, the protection layer 180 may include a contact hole 182 overlapping with a part of the drain electrode 175.

The protection layer 180 may be made of an acrylic resin, an epoxy resin, a phenolic resin, a polyamide resin, a polyimide resin, an unsaturated polyesters resin, a polyphenylene resin, a polyphenylene sulfide resin, and benzocyclobutene (BCB).

The light-emitting element EL is disposed on the passivation (or protection) layer 180. The light-emitting element EL includes a first electrode 191, a second electrode 270 disposed on the first electrode 191, and an emission layer 370 disposed between the first electrode 191 and the second electrode 270.

The first electrode 191 is disposed on the protection layer 180. The first electrode 191 may include a transparent conductive material such as an indium-tin oxide (ITO), an indium-zinc oxide (IZO), a zinc oxide (ZnO), or an indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The first electrode 191 is electrically connected to the drain electrode 175 of the thin film transistor through the contact hole 182 formed in the protection layer 180, thereby being an anode of the light-emitting element EL. The first electrode 191 may include a first transparent electrode and a second transparent electrode that are made of a transparent conductive material, and a transflective layer disposed between the first transparent electrode and the second transparent electrode and used to form a microcavity along with a second electrode 270. That is, the first electrode 191 may be made of a multilayer including a layer made of the transparent conductive material and a layer made of a reflective metal.

A pixel definition layer 350 is disposed on the protection layer 180 and the edge part of the first electrode 191. The pixel definition layer 350 may include resins such as polyacryl-based (polyacrylics), polyimide-based (polyimides), or silica-based inorganic materials.

The emission layer 370 is disposed on the first electrode 191. The emission layer 370 may include at least one of an organic light emitting material or an inorganic light emitting material. The emission layer 370 may include any one of a red emission layer that emits red light, a green emission layer that emits green light, and a blue emission layer that emits blue light. The red emission layer, the green emission layer, and the blue emission layer are each formed in the different pixels, so that a color image may be implemented by a combination thereof. In addition, the emission layer 370 may include a white emission layer that emits a white light, and a color image may be implemented by forming one of a red filter, a green filter, and a blue filter in each pixel.

The second electrode 270 is disposed on the emission layer 370 and the pixel definition layer 350. The second electrode 270 may be made of the transparent conductive material such as an indium-tin oxide (ITO), an indium-zinc oxide (IZO), a zinc oxide (ZnO), or an indium oxide (In2O3), or the reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The second electrode 270 becomes a cathode of the light-emitting element EL.

The portion of the second electrode 270 that overlaps the pixel definition layer 350 is protruded compared to other portions, so the upper surface of the second electrode 270 may not be flat.

The planarization layer 420 may be disposed on the second electrode 270 and the upper surface may be flat. The planarization layer 420 may be made of a transparent organic material. For example, the planarization layer 420 is an organic insulating material such as an acryl-based resin, an epoxy-based resin, a phenol-based resin, a polyamide-based resin, a polyimide-based resin, an unsaturated polyester-based resin, a polyphenylene-based resin, a polyphenylene-based sulfide resin, or benzocyclobutene, etc.

When implementing a flexible display device by bending the substrate 110, the planarization layer 420 may play a role of improving element safety by absorbing the impact transmitted to elements such as the transistor, the first electrode 191, and the second electrode 270.

The first buffer layer 410, which serves to protect the light-emitting element EL, may be further disposed between the second electrode 270 and the planarization layer 420. A second buffer layer 430 may be disposed on the planarization layer 420. The first and second buffer layers 410 and 430 may be made of an inorganic insulating material, and may have a single layer or multilayer structure. For example, the first and second buffer layers 410 and 430 may include an inorganic material such as a silicon oxide (SiOx), a silicon nitride (SiNx), or a silicon oxynitride (SiON). According to some embodiments, at least one of the first or second buffer layers 410 or 430 may be omitted. In the following description, the second buffer layer 430 is omitted.

The first refractive index layer 510 is disposed on the planarization layer 420. The first refractive index layer 510 may overlap with the pixel definition layer 350 and may not overlap with the light emission region ER. The light emission region ER is a region in which light is emitted from the light-emitting element EL, and is a region where the emission layer 370 is in contact with both the first electrode 191 and the second electrode 270. The first refractive index layer 510 may be disposed in the shape of a loop surrounding the light emission region ER on a plane. The first refractive index layer 510 may include an opening OP corresponding to the light emission region ER. The size of the opening OP may be the same as that of the light emission region ER. Alternatively, according to some embodiments, the opening OP may be formed larger than the light emission region ER by a set or predetermined size. That is, the first refractive index layer 510 may be spaced apart a distance (e.g., a set or predetermined distance) from the light emission region ER in the horizontal direction.

The first refractive index layer 510 may include a total reflection inclination surface 510T total-reflecting light emitted from the light-emitting element EL in the front direction and a refraction inclination surface 510R refracting light emitted from the light-emitting element EL in the front direction. The front direction means a direction perpendicular to the upper surface of the substrate 110 and indicates the upward direction in FIG. 1. The total reflection inclination surface 510T may be an inner side surface of the ring-shaped first refractive index layer 510, and the refraction inclination surface 510R may be an outer side surface of the ring-shaped first refractive index layer 510.

The total reflection inclination surface 510T is an inclination surface that forms an opening OP, and may be inclined in a total reflection inclination angle $\theta$ with respect to the upper surface of the substrate 110. That is, the lower surface of the first refractive index layer 510 in contact with the planarization layer 420 forms the opening OP, and the inner side surface connecting the lower surface and the upper surface of the first refractive index layer 510 is inclined with the slope of the total reflection inclination angle $\theta$ in the direction toward the outside (i.e., the outside of the ring shape of the opening OP), thereby forming the total reflection inclination surface 510T.

The refraction inclination surface 510R may be inclined at a refraction inclination angle $\lambda$ with respect to the upper surface of the substrate 110. That is, the outer side surface connecting the lower surface and the upper surface of the first refractive index layer 510 may be inclined with the slope of the refraction inclination angle $\lambda$ in the direction toward the inside of the opening OP (i.e., the inside of the ring shape).

The second refractive index layer 520 is disposed on the first refractive index layer 510 and the planarization layer 420. The second refractive index layer 520 overlaps the pixel definition layer 350 and is in contact with the refraction inclination surface 510R of the first refractive index layer 510. That is, the refraction inclination surface 510R may be an interface between the first refractive index layer 510 and the second refractive index layer 520. The thickness H2 of the second refractive index layer 520 may be the same as the thickness H1 of the first refractive index layer 510, and the side of the second refractive index layer 520 may be in contact with the refraction inclination surface 510R of the first refractive index layer 510. The thickness H1 of the first refractive index layer 510 is a height from the lower surface to the upper surface of the first refractive index layer 510, and the thickness H2 of the second refractive index layer 520 is a height from the lower surface to the upper surface of the second refractive index layer 520. The thickness H1 of the first refractive index layer 510 may be about 1.5 µm to 3.0 µm. The thickness H2 of the second refractive index layer 520 may be about 1.5 µm to 3.0 µm. However, the thickness H1 of the first refractive index layer 510 and the thickness H2 of the second refractive index layer 520 may be different, which is described later with reference to FIG. 9 and FIG. 10.

The third refractive index layer 530 is disposed on the first refractive index layer 510 and second refractive index layer 520. The third refractive index layer 530 may be formed to cover the entire upper surface of the substrate 110, and may overlap the light-emitting element EL in the opening OP of the first refractive index layer 510. The third refractive index layer 530 is in contact with the total reflection inclination surface 510T of the first refractive index layer 510. That is, the total reflection inclination surface 510T may be an interface between the first refractive index layer 510 and the third refractive index layer 530.

The first to third refractive index layers 510, 520, and 530 may be made of a mixture of a transparent organic material or an inorganic material, and an organic material. The first refractive index layer 510 may be formed to have a refractive index (e.g. a set or predetermined refractive index), and the second refractive index layer 520 may be formed to have a smaller refractive index than the refractive index of the first refractive index layer 510. Also, the third refractive index layer 530 may be formed to have a greater refractive index than the refractive index of the first refractive index layer 510. That is, the refractive index of the first refractive index layer 510 may be larger than the refractive index of the second refractive index layer 520, and the refractive index of the third refractive index layer 530 may be larger than the refractive index of the first refractive index layer 510. A refractive index difference between the first refractive index layer 510 and the second refractive index layer 520 may be 0.05 or more. A refractive index difference between the first refractive index layer 510 and the third refractive index layer 530 may be 0.05 or more. The refractive index of each of the first refractive index layer 510, the second refractive index layer 520, and the third refractive index layer 530 may be determined in a range of about 1.2 to 1.9.

When light generated from the light-emitting element EL is incident from the third refractive index layer 530 into the first refractive index layer 510, light is totally reflected from the total reflection inclination surface 510T due to the refractive index difference between the first refractive index layer 510 and the third refractive index layer 530, so that it may proceed in the front direction. When light generated from the light-emitting element EL enters the second refractive index layer 520 from the first refractive index layer 510, the light is refracted from the refraction inclination surface 510R by the refractive index difference between the first refractive index layer 510 and the second refractive index layer 520, so that it may proceed in the front direction.

A polarization layer 610 may be disposed on the third refractive index layer 530, and a cover window 620 may be disposed on the polarization layer 610.

Meanwhile, a plurality of touch electrodes 710 and 720 for sensing a touch may be disposed in a region overlapping the pixel definition layer 350. The first touch electrode 710 may be disposed between the planarization layer 420 and the second refractive index layer 520, and the second touch electrode 720 may be disposed on the second refractive index layer 520. The first touch electrode 710 may include a plurality of transmitting electrodes for transmitting a touch signal for sensing a touch, and a plurality of receiving electrodes for forming a capacitance with the transmitting electrodes. The second touch electrode 720 may be a bridge electrode connecting a plurality of transmitting electrodes to each other or connecting a plurality of receiving electrodes to each other through a contact hole formed in the second refractive index layer 520.

Next, the total reflection inclination angle $\theta$ of the total reflection inclination surface 510T and the refraction inclination angle $\lambda$ of the refraction inclination surface 510R are described further in detail with reference to FIG. 2 to FIG. 8.

Figure 2:
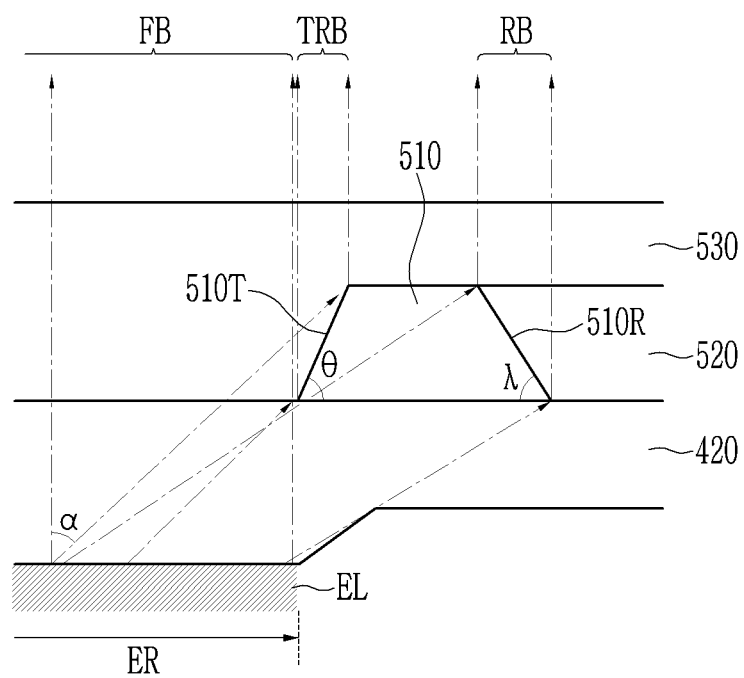
FIG. 2 is a cross-sectional view showing some layers of a display device of FIG. 1 according to some embodiments.

FIG. 2 is a cross-sectional view of some layers of a display device of FIG. 1. FIG. 2 shows the light-emitting element EL, the planarization layer 420, the first refractive index layer 510, the second refractive index layer 520, and the third refractive index layer 530, and an optical path is indicated by an arrow.

Referring to FIG. 2, the light generated from the light-emitting element EL travels in the front direction, and may not only be emitted as a front light FB, and but may also be emitted obliquely with respect to the front direction. The side light that is obliquely emitted with the light emission angle $\alpha$ (here, 0 degrees<$\alpha$<90 degrees) with respect to the front direction is totally reflected by the total reflection inclination surface 510T, and may traverse in the front direction to be emitted as total reflection light TRB. In addition, another part of the side light may be refracted from the refraction inclination surface 510R and proceed in the front direction to be emitted as refraction light RB. In this way, a region in which the light is emitted in the front direction in one pixel may include the regions of the front light FB, the total reflection light TRB, and the refraction light RB. On a plane, the region of the front light FB may correspond to the light emission region ER of the light-emitting element EL, the region of the total reflection light TRB may correspond to the total reflection inclination surface 510T, and the region of the refraction light RB may correspond to the refraction inclination surface 510R. In this way, the region in which the light is emitted in the front direction by the first to third refractive index layers 510, 520, and 530 may be extended as much as the regions of the total reflection light TRB and the refraction light RB, and thus the light emission efficiency in the front direction may be improved.

Next, the relationship of the refractive index, the light emission angle $\alpha$, and the total reflection inclination angle $\theta$ of the first refractive index layer 510 and the third refractive index layer 530 is described with reference to FIG. 3 and FIG. 4.

Figure 3:
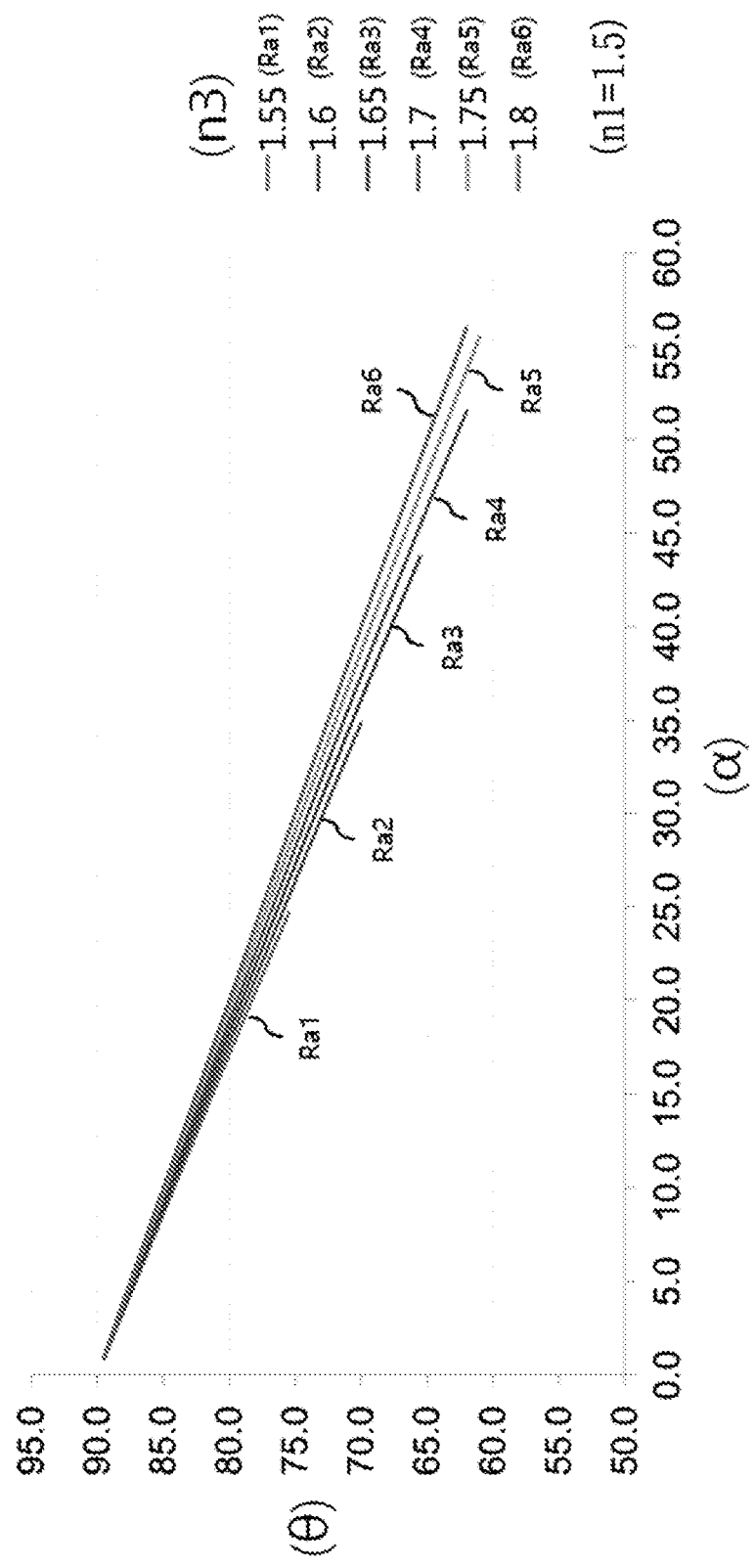
FIG. 3 is a graph showing a relationship of a light emission angle and a total reflection inclination angle for front light emission according to some embodiments of the present invention.

FIG. 3 is a graph showing a relationship of a light emission angle and a total reflection inclination angle for front light emission according to some embodiments of the present invention.

Referring to FIG. 3, when the refractive index n1 of the first refractive index layer 510 is 1.5, cases in which the refractive index n3 of the third refractive index layer 530 is 1.55, 1.6, 1.65, 1.7, 1.75, and 1.8, graphs Ra1, Ra2, Ra3, Ra4, Ra5, and Ra6 of which the relationship of the total reflection inclination angle $\theta$ for the light emission angle $\alpha$ are determined.

When the refractive index n1 of the first refractive index layer 510 is 1.5 and the refractive index n3 of the third refractive index layer 530 is 1.55, for the light of which the light emission angle $\alpha$ is larger than 0 degrees and 24.7 degrees or less, the total reflection inclination angle $\theta$ may be determined as a range of less than 90 degrees to 75.5 degrees or more.

When the refractive index n1 of the first refractive index layer 510 is 1.5 and the refractive index n3 of the third refractive index layer 530 is 1.6, for the light of which the light emission angle α is larger than 0 degrees and 34.85 degrees or less, the total reflection inclination angle θ may be determined as a range of smaller than 90 degrees to 70.0 degrees or more.

When the refractive index n1 of the first refractive index layer 510 is 1.5 and the refractive index n3 of the third refractive index layer 530 is 1.65, for the light of which the light emission angle α is greater than 0 degrees and 43.77 degrees or less, the total reflection inclination angle θ may be determined as a range of smaller than 90 degrees and 65.5 degrees or more.

When the refractive index n1 of the first refractive index layer 510 is 1.5 and the refractive index n3 of the third refractive index layer 530 is 1.7, for the light of which the light emission angle α is larger than 0 degrees and 51.53 degrees or less, the total reflection inclination angle θ may be determined as a range of smaller than 90 degrees and 62.0 degrees or more.

When the refractive index n1 of the first refractive index layer 510 is 1.5 and the refractive index n3 of the third refractive index layer 530 is 1.75, for the light of which the light emission angle α is larger than 0 degrees and 55.54 degrees or less, the total reflection inclination angle θ may be determined as a range of smaller than 90 degrees and 61.0 degrees or more.

When the refractive index n1 of the first refractive index layer 510 is 1.5 and the refractive index n3 of the third refractive index layer 530 is 1.8, for the light of which the emission angle α is larger than 0 degrees and 56 degrees or less, the total reflection inclination angle θ may be determined as a range of smaller than 90 degree and 62.0 degrees or more.

As shown in the experiment results, as the difference between the refractive index n1 of the first refractive index layer 510 and the refractive index n3 of the third refractive index layer 530 is greater, the light having the broader range of the light emission angle α may be totally reflected in the front direction.

Figure 4:
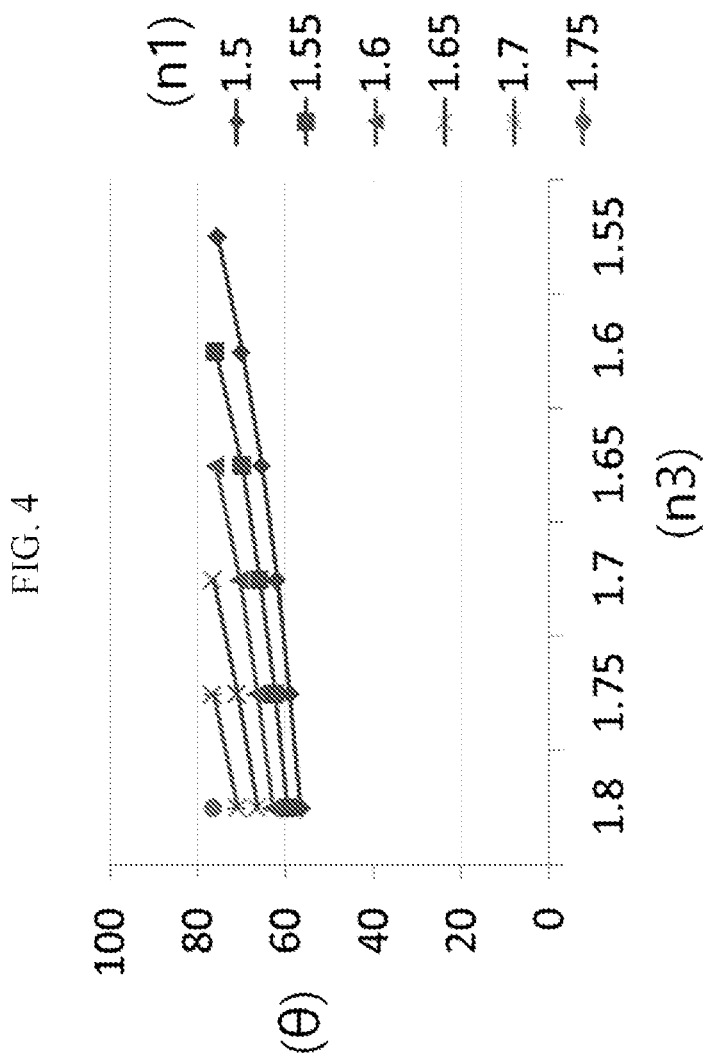
FIG. 4 is a graph showing a relationship of a refractive index of a refractive index layer and a total reflection inclination angle for front light emission according to some embodiments of the present invention.

FIG. 4 is a graph showing a relationship of a refractive index of a refractive index layer and a total reflection inclination angle for front light emission according to some embodiments of the present invention.

Referring to FIG. 4, when the refractive index n1 of the first refractive index layer 510 is 1.5, 1.55, 1.6, 1.65, 1.7, and 1.75, in a case that the refractive index n3 of the third refractive index layer 530 is determined to be larger than the refractive index n1 of the first refractive index layer 510 by 0.05 or more, a graph in which a minimum value of the total reflection inclination angle θ capable of totally reflecting the light is shown.

When the difference between the refractive index n1 of the first refractive index layer 510 and the refractive index n3 of the third refractive index layer 530 is 0.05, the minimum value of the total reflection inclination angle θ capable of totally reflecting the light is a value between about 75.5 degrees and 76.5 degrees.

When the difference between the refractive index n1 of the first refractive index layer 510 and the refractive index n3 of the third refractive index layer 530 is 0.10, the minimum value of the total reflection inclination angle θ capable of totally reflecting the light is a value between about 70 degrees and 71 degrees.

When the difference between the refractive index n1 of the first refractive index layer 510 and the refractive index n3 of the third refractive index layer 530 is 0.15, the minimum value of the total reflection inclination angle θ capable of totally reflecting the light is a value between about 65.5 degrees and 66.5 degrees.

When the difference between the refractive index n1 of the first refractive index layer 510 and the refractive index n3 of the third refractive index layer 530 is 0.2, the minimum value of the total reflection inclination angle θ capable of totally reflecting the light is a value between about 62 degrees and 63 degrees.

When the difference between the refractive index n1 of the first refractive index layer 510 and the refractive index n3 of the third refractive index layer 530 is 0.25, the minimum value of the total reflection inclination angle θ capable of totally reflecting the light is a value between about 59 degrees and 59.5 degrees.

When the difference between the refractive index n1 of the first refractive index layer 510 and the refractive index n3 of the third refractive index layer 530 is 0.25, the minimum value of the total reflection inclination angle θ capable of totally reflecting the light is about 56.5 degrees.

As in the experiment result, the greater the difference between the refractive index n1 of the first refractive index layer 510 and the refractive index n3 of the third refractive index layer 530, the smaller the total reflection inclination angle θ. For example, the total reflection inclination angle θ may be determined in a range of less than 90 degrees and 50 degrees or more.

Next, the refractive index, the light emission angle α, and the refraction inclination angle λ of the first refractive index layer 510 and the second refractive index layer 520 are described with reference to FIG. 5 to FIG. 8.

Figure 5:
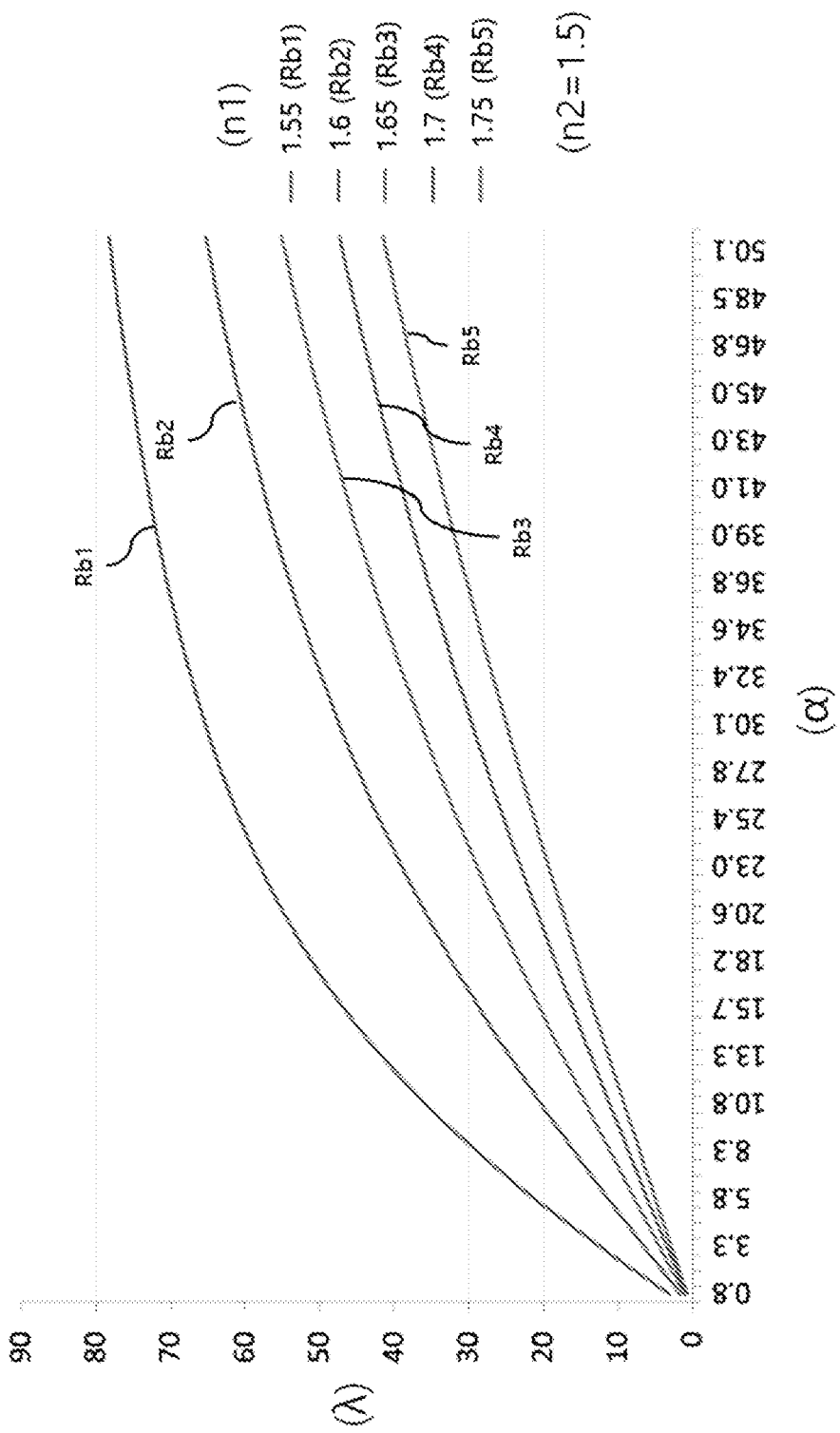
FIG. 5 is a graph showing a relationship of a light emission angle and a refraction inclination angle for a front light emission according to some embodiments of the present invention.

FIG. 5 is a graph showing a relationship of a light emission angle and a refraction inclination angle for front light emission according to some embodiments of the present invention.

Referring to FIG. 5, when the refractive index n2 of the second refractive index layer 520 is 1.5, cases in which the refractive index n1 of the first refractive index layer 510 is 1.55, 1.6, 1.65, 1.7, and 1.75, graphs Rb1, Rb2, Rb3, Rb4, and Rb5 of which the relationship of the refraction inclination angle λ for the light emission angle α is reflected are shown.

The refraction inclination angle λ of the refraction inclination surface 510R for the refraction of the incident light in the front direction may be determined according to Equation 1.

$$\tan\lambda = \frac{\sin\alpha}{\cos\alpha - (n2/n1)} \qquad \text{Equation 1}$$

Here, λ is a refraction inclination angle, α is a light emission angle, n1 is a refractive index of a first refractive index layer 510, and n2 is a refractive index of a second refractive index layer 520.

By Equation 1, when the refractive index n2 of the second refractive index layer 520 is 1.5 and the refractive index n1 of the first refractive index layer 510 is 1.55, the relationship graph Rb1 of the refraction inclination angle λ for the light emission angle α may be calculated.

Likewise, when the refractive index n2 of the second refractive index layer 520 is 1.5 and the refractive index n1 of the first refractive index layer 510 is 1.6, the relationship graph Rb2 of the refraction inclination angle λ for the light emission angle α may be calculated. When the refractive index n2 of the second refractive index layer 520 is 1.5 and the refractive index n1 of the first refractive index layer 510 is 1.65, the relationship graph Rb3 of the refraction inclination angle λ for the light emission angle α may be calculated. When the refractive index n2 of the second refractive index layer 520 is 1.5 and the refractive index n1 of the first refractive index layer 510 is 1.7, the relationship graph Rb4 of the refraction inclination angle λ for the light emission angle α may be calculated. When the refractive index n2 of the second refractive index layer 520 is 1.5 and the refractive index n1 of the first refractive index layer 510 is 1.75, the relationship graph Rb5 of the refraction inclination angle λ for the light emission angle α may be calculated.

Figure 6:
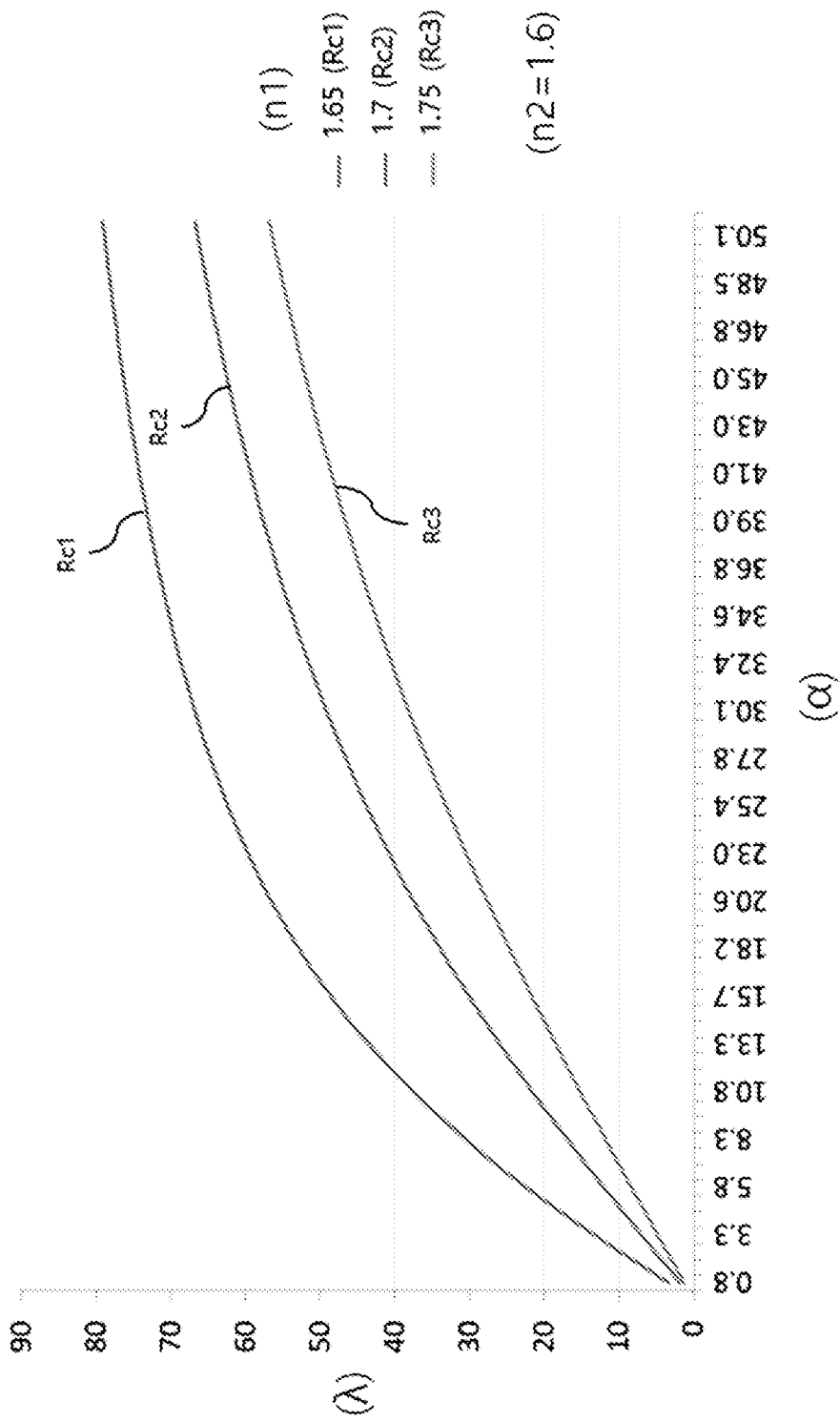
FIG. 6 is a graph showing a relationship of a light emission angle and a refraction inclination angle for a front light emission according to some embodiments of the present invention.

FIG. 6 is a graph showing a relationship of a light emission angle and a refraction inclination angle for a front light emission according to some embodiments of the present invention.

Referring to FIG. 6, when the refractive index n2 of the second refractive index layer 520 is 1.6, in a case that the refractive index n1 of the first refractive index layer 510 is 1.65, 1.7, and 1.75, the graphs Rc1, Rc2, and Rc3, which are determined with the relationship of the refraction inclination angle λ for the light emission angle α, are shown.

Likewise, the relationship graphs Rc1, Rc2, and Rc3 of the refraction inclination angle λ for the light emission angle α may be calculated by Equation 1.

Figure 7:
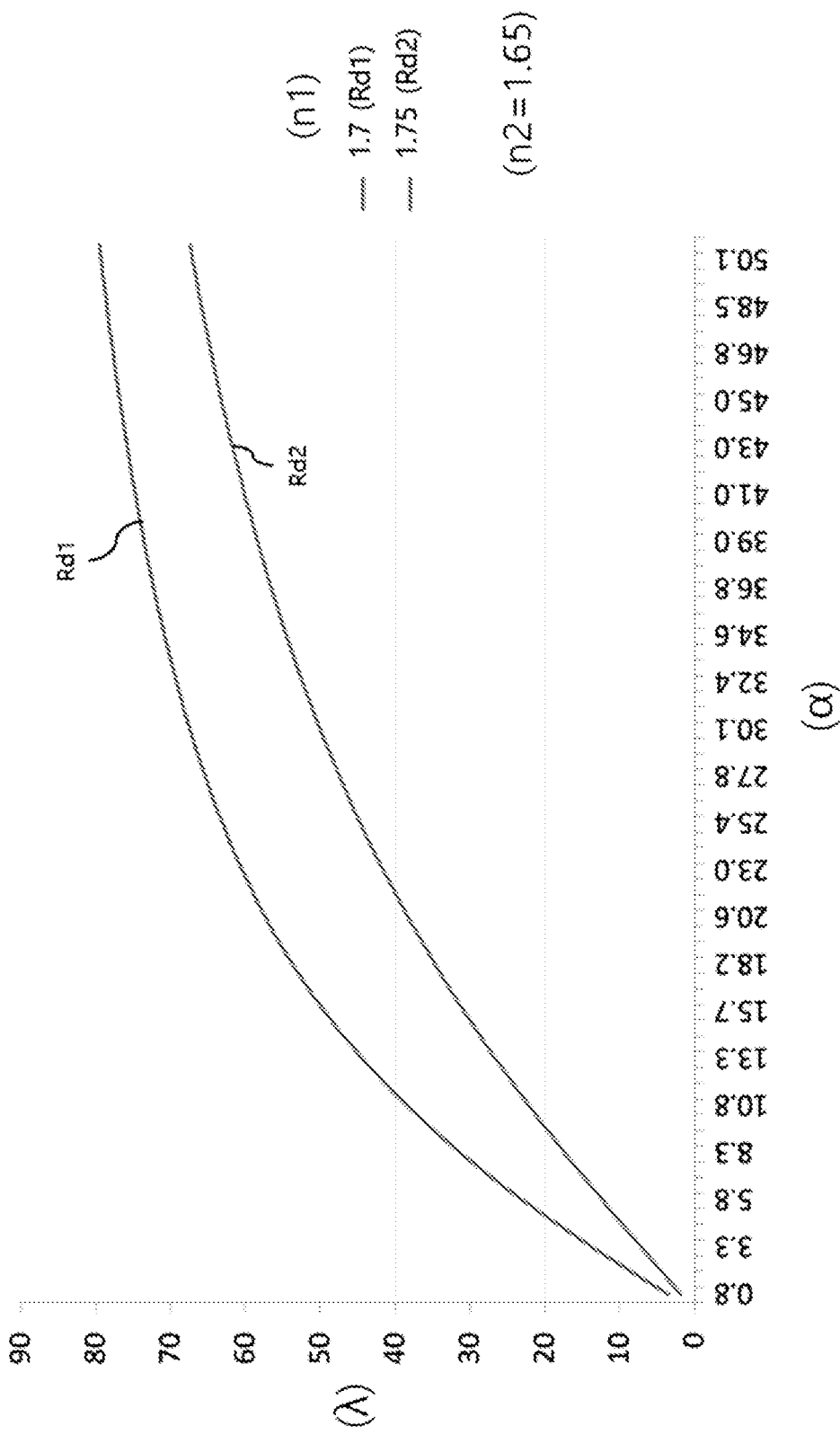
FIG. 7 is a graph showing a relationship of a light emission angle and a refraction inclination angle for a front light emission according to some embodiments of the present invention.

FIG. 7 is a graph showing a relationship of a light emission angle and a refraction inclination angle for a front light emission according to some embodiments of the present invention.

Referring to FIG. 7, when the refractive index n2 of the second refractive index layer 520 1.65, in a case that the refractive index n1 of the first refractive index layer 510 is 1.7 and 1.75, the graphs Rd1 and Rd2, which are determined with the relationship of the refraction inclination angle λ for the light emission angle α, are shown.

Likewise, the relationship graphs Rd1 and Rd2 of the refraction inclination angle λ for the light emission angle α may be calculated by Equation 1.

Figure 8:
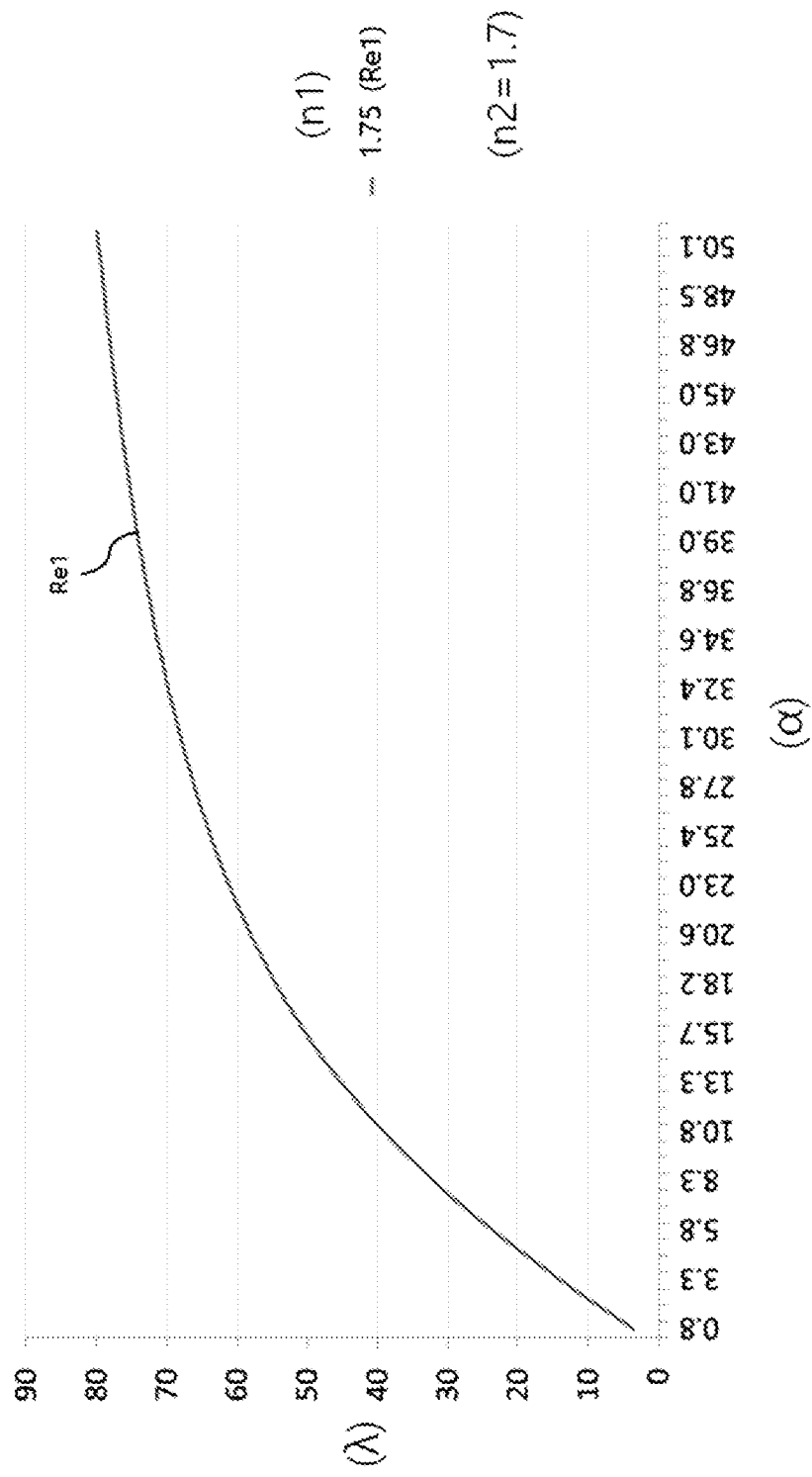
FIG. 8 is a graph showing a relationship of a light emission angle and a refraction inclination angle for a front light emission according to some embodiments of the present invention.

FIG. 8 is a graph showing a relationship of a light emission angle and a refraction inclination angle for front light emission according to some embodiments of the present invention.

Referring to FIG. 8, when the refractive index n2 of the second refractive index layer 520 is 1.7, in a case that the refractive index n1 of the first refractive index layer 510 is 1.75, a graph Re1, which is determined with the relationship of the refraction inclination angle λ for the light emission angle α, is shown.

Likewise, a relationship graph Re1 of the refraction inclination angle λ for the light emission angle α may be calculated by Equation 1.

As shown in an experimental result of FIG. 5 to FIG. 8, the refraction inclination angle λ may be determined as a range that is larger than 0 degrees and less than 90 degrees, when actually considering the refractive index n1 of the first refractive index layer 510, the refractive index n2 of the second refractive index layer 520, and the thickness of the planarization layer 420, the refraction inclination angle λ may be determined as a range from about 50 degrees or more to less than 90 degrees.

In this case, the larger the difference between the refractive index n1 of the first refractive index layer 510 and the refractive index n2 of the second refractive index layer 520, the smaller the size of the refraction inclination angle A. When the thickness of the first refractive index layer 510 is set or predetermined with a constant or uniform thickness, as the size of the refraction inclination angle λ becomes smaller, the region of the refraction light RB increases, so the region in which the light is emitted in the front direction may be further expanded. That is, by determining the size of the refraction inclination angle λ that is appropriate depending on Equation 1 by considering the thickness of the first refractive index layer 510, the refractive index n1 of the first refractive index layer 510, and the refractive index n2 of the second refractive index layer 520, it is possible to determine the region from which the light is emitted in the front direction.

Hereinafter, embodiments in which some configurations of the display device of FIG. 1 are differentiated is described with reference to FIG. 9 and FIG. 10. The explanation is focused on difference points compared with FIG. 1.

Figure 9:
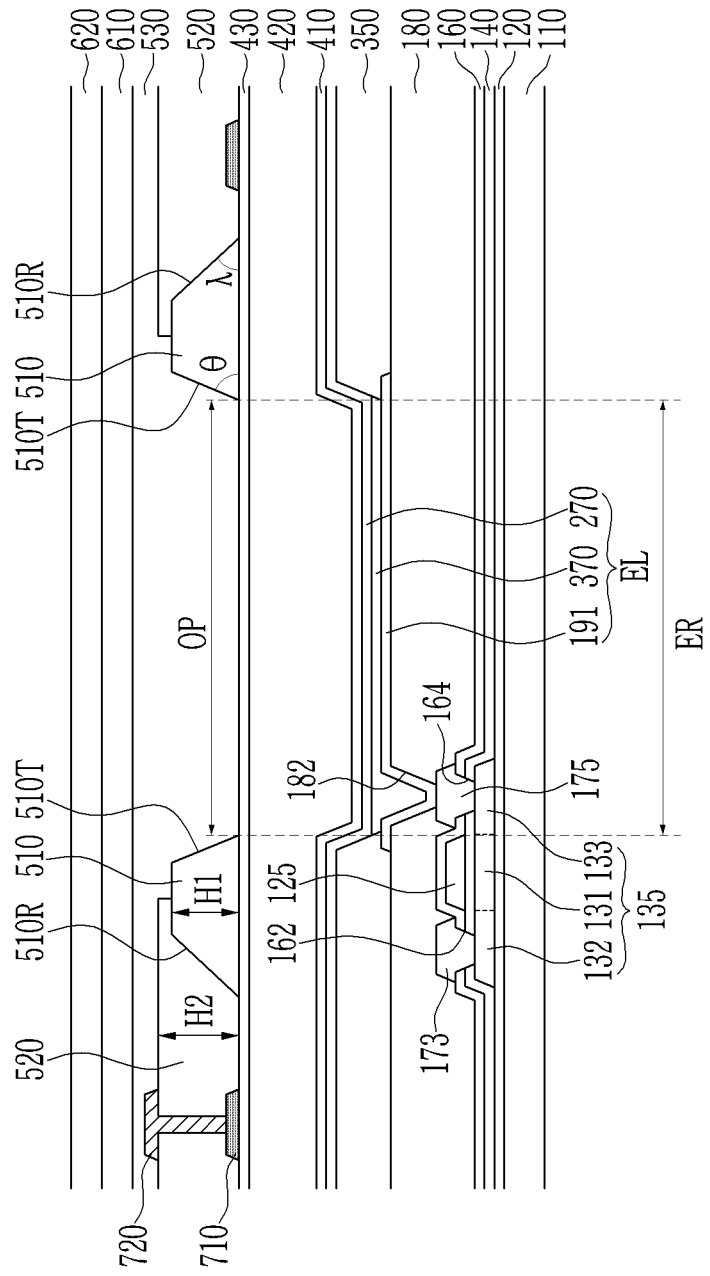
FIG. 9 is a cross-sectional view of a display device differentiating some configurations from a display device of FIG. 1 according to some embodiments.

FIG. 9 is a cross-sectional view of a display device differentiating some configurations from a display device of FIG. 1.

Referring to FIG. 9, the thickness H2 of the second refractive index layer 520 may be larger than the thickness H1 of the first refractive index layer 510. The second refractive index layer 520 may cover the refraction inclination surface 510R of the first refractive index layer 510 and a part of the upper surface of the first refractive index layer 510. The second refractive index layer 520 does not cover the total reflection inclination surface 510T of the first refractive index layer 510.

Except for these different points, the features of the embodiments described with reference to FIG. 1 may all be applied to the embodiments described with reference to FIG. 9, and some duplicate descriptions of the features of the embodiments described in FIG. 1 are omitted.

Figure 10:
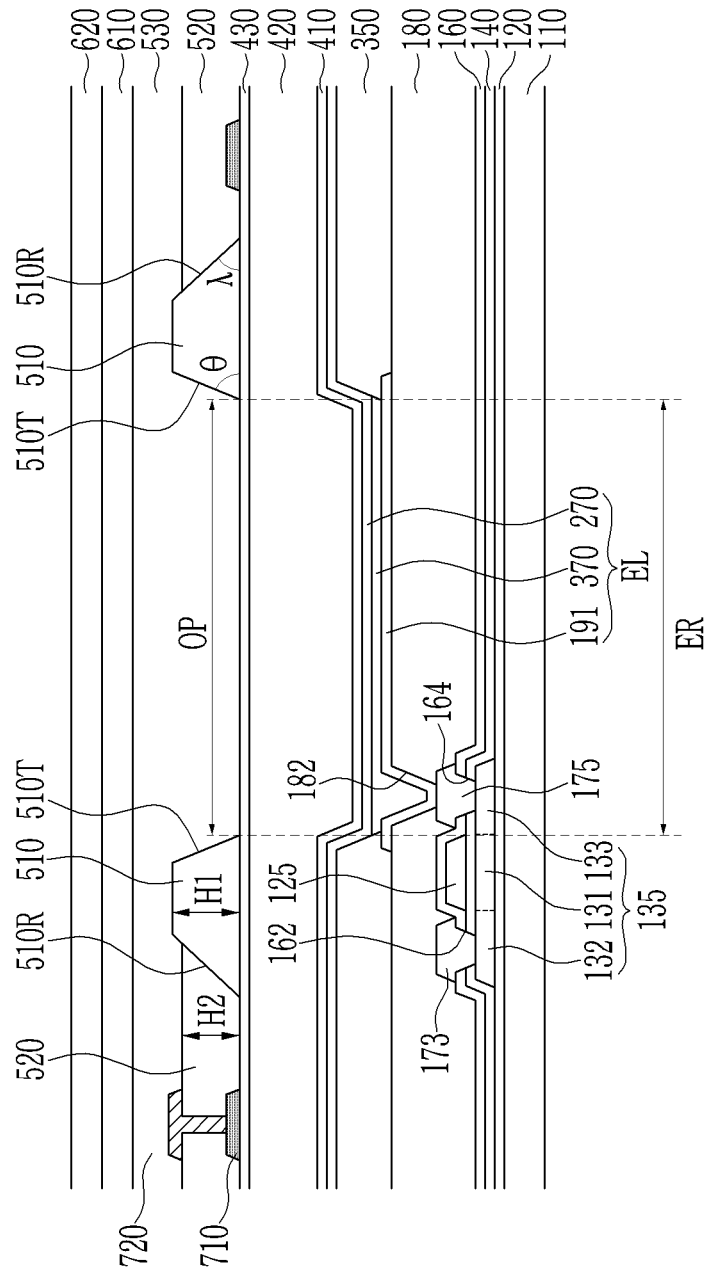
FIG. 10 is a cross-sectional view of a display device differentiating some configurations from a display device of FIG. 1 according to some embodiments.

FIG. 10 is a cross-sectional view of a display device differentiating some configurations from a display device of FIG. 1.

Referring to FIG. 10, the thickness H2 of the second refractive index layer 520 may be smaller than the thickness H1 of the first refractive index layer 510. The second refractive index layer 520 may cover a part of the refraction inclination surface 510R of the first refractive index layer 510. That is, the second refractive index layer 520 may be in contact with a part of the refraction inclination surface 510R of the first refractive index layer 510. The remaining part of the refraction inclination surface 510R that is not in contact with the second refractive index layer 520 is in contact with the third refractive index layer 530.

In the refraction inclination surface 510R in contact with the third refractive index layer 530, the light is not refracted in the front direction, but the light is refracted in the lateral direction to proceed. In order to improve the light emission efficiency in the front direction, as shown in FIG. 1 or FIG. 9, it is more advantageous to make all the refraction inclination surface 510R in contact with the second refractive index layer 520. However, for purposes such as improving the side visibility, as shown in FIG. 10, a part of the refraction inclination surface 510R may be in contact with the third refractive index layer 530.

Excluding these differences, the features of the embodiments described with reference to FIG. 1 may all be applied to the embodiments described with reference to FIG. 10, and the duplicate descriptions of the features of the embodiments described in FIG. 1 are omitted.

Hereinafter, a form in which a plurality of pixels included in the display device are arranged on a plane is described with reference to FIG. 11 to FIG. 13.

Figure 11:
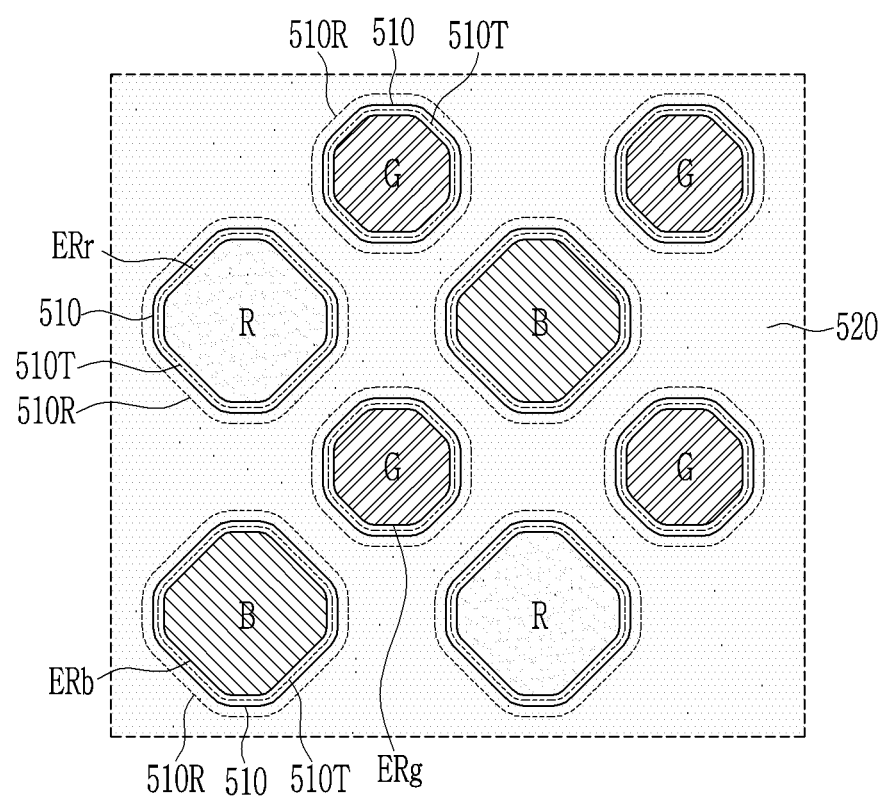
FIG. 11 to FIG. 13 are a top plan view showing various arrangement shapes of a plurality of pixels included in a display device according to some embodiments of the present invention.
Figure 12:
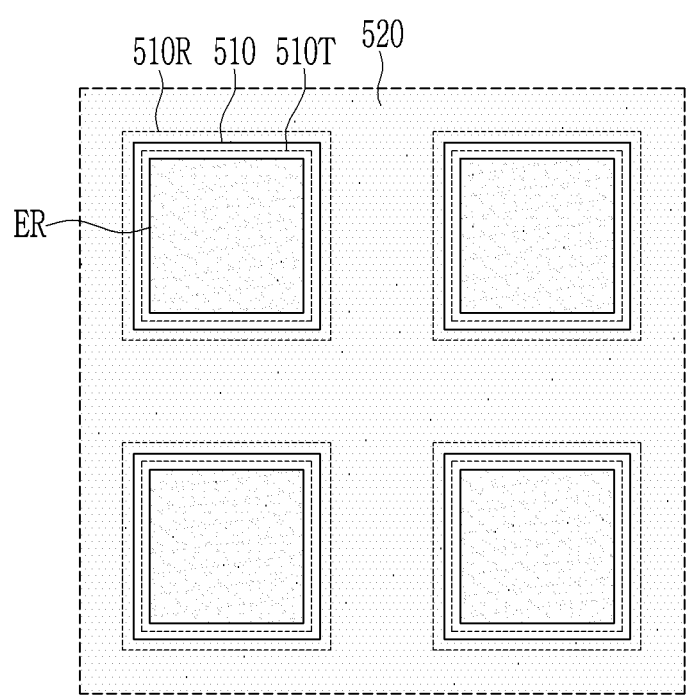
Figure 13:
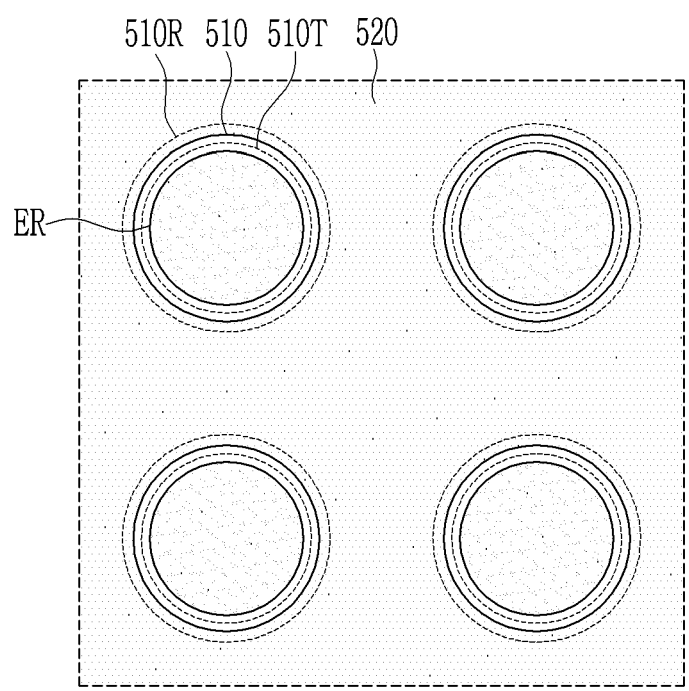

FIG. 11 to FIG. 13 are top plan views showing various arrangement shapes of a plurality of pixels included in a display device according to some embodiments of the present invention.

Referring to FIG. 11, a plurality of pixels may be arranged in a pentile shape. A plurality of pixels may include a red light emission region ERr, a green light emission region ERg, and a blue light emission region ERb. Each light emission region ERr, Erg, and ERb may be made of polygons such as approximate quadrangles and octagons. The red light emission region ERr and the green light emission region ERg may be alternately disposed in a diagonal direction, and the blue light emission region ERb and the green light emission region ERg may be alternately disposed in a diagonal direction. The red light emission region ERr, the green light emission region ERg, and the blue light emission region ERb respectively correspond to different pixels, and a color image may be implemented by a combination thereof.

The first refractive index layer 510 may be formed in a ring shape surrounding each of the red light emission region ERr, the green light emission region ERg, and the blue light emission region ERb. The first refractive index layer 510 may not overlap with the red light emission region ERr, the green light emission region ERg, and the blue light emission region ERb. The total reflection inclination surface 510T may be disposed inside the ring-shaped first refractive index layer 510, and the refraction inclination surface 510R may be disposed outside the ring-shaped first refractive index layer 510.

The second refractive index layer 520 is disposed around the red light emission region ERr, the green light emission region Erg, and the blue light emission region ERb, and overlaps the refraction inclination surface 510R without overlapping the total reflection inclination surface 510T.

The arrangement of a plurality of pixels is not limited thereto, and as shown FIG. 12 and FIG. 13, a plurality of pixels may be arranged in a matrix form.

As shown in FIG. 12, a plurality of pixels may be arranged in a matrix form, and the light emission regions ER of each of a plurality of pixels may be formed in a quadrangle. Also, as shown in FIG. 13, a plurality of pixels may be arranged in a matrix form, and the light emission region ER of each of a plurality of pixels may have a circular shape.

The size of the light emission region ER of a plurality of pixels may be the same. However, the present invention is not limited thereto, and the size of the light emission region ER of a plurality of pixels may be different. For example, the sizes of the light emission regions ER having the same color may be the same, and the size of the light emission regions ER having the different colors may be different.

The first refractive index layer 510 may be formed as a quadrangle or circular with the ring shape surrounding the light emission region ER, the total reflection inclination surface 510T may be disposed inside the first refractive index layer 510 in a ring shape, and the refraction inclination surface 510R may be disposed on the outside of the first refractive index layer 510 of the ring shape.

The second refractive index layer 520 may be disposed around the light emission region ER, and may overlap with the refraction inclination surface 510R without overlapping with the total reflection inclination surface 510T.

Next, the display device according to some embodiments of the present invention is described with reference to FIG. 14. The explanation is mainly based on the differences compared with FIG. 1.

Figure 14:
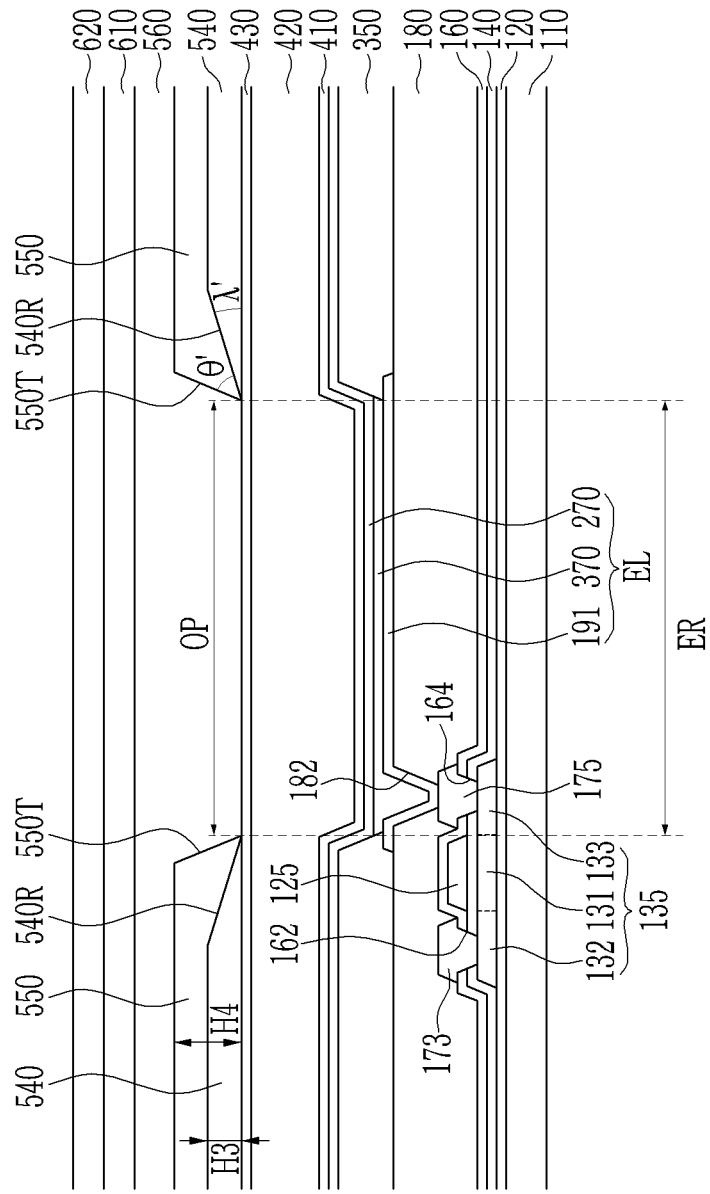
FIG. 14 is a cross-sectional view of a display device according to some embodiments of the present invention.

FIG. 14 is a cross-sectional view of a display device according to some embodiments of the present invention.

Referring to FIG. 14, a first refractive index layer 540 is disposed on the planarization layer 420.

The first refractive index layer 540 may overlap with the pixel definition layer 350 and may not overlap with the light emission region ER. The first refractive index layer 540 may include a refraction inclination surface 540R that refracts the light emitted from the light-emitting element EL in a front direction.

A second refractive index layer 550 is disposed on the first refractive index layer 540.

The second refractive index layer 550 may overlap with the pixel definition layer 350 and may not overlap with the light emission region ER. The second refractive index layer 550 may cover all of the first refractive index layer 540. That is, the second refractive index layer 550 may cover the refraction inclination surface 540R and the upper surface of the first refractive index layer 540. The refraction inclination surface 540R is in contact with the second refractive index layer 550. The second refractive index layer 550 may include an opening OP corresponding to the light emission region ER. The size of the opening OP may be the same as that of the light emission region ER. Also, according to some embodiments, the opening OP may be formed to be larger than the light emission region ER by a size (e.g., a set or predetermined size). That is, the second refractive index layer 550 may be spaced apart from the light emission region ER in a horizontal direction by a distance (e.g., a set or predetermined distance). The first refractive index layer 540 may include an opening OP that is the same as the second refractive index layer 550 or an opening of a size that is larger than the opening OP of the second refractive index layer 550.

The second refractive index layer 550 may include a total reflection inclination surface 550T totally reflecting the light emitted from the light-emitting element EL in the front direction. The total reflection inclination surface 550T as an inclination surface forming an opening OP may be inclined in a total reflection inclination angle θ' with respect to the upper surface of the substrate 110. That is, the lower surface of the second refractive index layer 550 forms the opening OP, and the lateral surface connecting the lower surface of the second refractive index layer 550 forming the opening OP and the upper surface may be inclined with the slope of the total reflection inclination angle θ' in the direction toward the outside of the opening OP.

The refraction inclination surface 540R may be inclined in a refraction inclination angle λ' with respect to the upper surface of the substrate 110. That is, the lateral surface connecting the lower surface and the upper surface of the first refractive index layer 540 may be inclined with a slope of the refraction inclination angle λ' in the direction toward the outside of the opening OP. The refraction inclination angle λ' may be smaller than the total reflection inclination angle θ'. Accordingly, a distance from the edge of the light emission region ER to the outermost of the refraction inclination surface 540R may be greater than a distance from the edge of the light emission region ER to the outermost of the total reflection inclination surface 550T. A part of the refraction inclination surface 540R may overlap the total reflection inclination surface 550T.

The thickness H4 of the second refractive index layer 550 may larger than the thickness H3 of the first refractive index layer 540. According to some embodiments, the thickness H4 of the second refractive index layer 550 may be the same as the thickness H3 of the first refractive index layer 540.

That is, the thickness H4 of the second refractive index layer 550 may be the thickness H3 of the first refractive index layer 540 or more. When the thickness H4 of the second refractive index layer 550 is the same as the thickness H3 of the first refractive index layer 540, the second refractive index layer 550 may cover the refraction inclination surface 540R of the first refractive index layer 540 and may not cover the upper surface of the first refractive index layer 540. The thickness of the first refractive index layer 540 may be about 1.5 μm to 3.0 μm. The thickness of the second refractive index layer 550 may be about 1.5 μm to 3.0 μm.

The third refractive index layer 560 is disposed on the second refractive index layer 550. The third refractive index layer 560 may be formed to cover the entire upper surface of the substrate 110, and may overlap with the light-emitting element EL at the opening OP of the second refractive index layer 550. The third refractive index layer 560 is in contact with the total reflection inclination surface 550T of the second refractive index layer 550.

The first refractive index layer 540 may be made of a transparent organic material or a transparent inorganic material, or a mixture of an organic material and an organic material. The second refractive index layer 550 and the third refractive index layer 560 may be made of a transparent organic material or a mixture of an inorganic material and an organic material. The first refractive index layer 540 may be formed to have a refractive index (e.g., a set or predetermined refractive index), and the second refractive index layer 550 may be formed to have a refractive index that is greater than that of the first refractive index layer 510. Also, the third refractive index layer 560 may be formed to have a refractive index that is greater than the refractive index of the second refractive index layer 550. That is, the refractive index of the second refractive index layer 550 may be greater than that of the first refractive index layer 540, and the refractive index of the third refractive index layer 560 may be greater than that of the second refractive index layer 550. The refractive index difference between the first refractive index layer 540 and the second refractive index layer 550 may be 0.05 or more. The refractive index difference between the second refractive index layer 550 and the third refractive index layer 560 may be 0.05 or more.

When the light generated from the light-emitting element EL is incident into the second refractive index layer 550 from the third refractive index layer 560, the light may be totally reflected from the total reflection inclination surface 550T, and traverse in the front direction by the refractive index difference between the second refractive index layer 550 and the third refractive index layer 560. Also, when the light generated from the light-emitting element EL is incident from the first refractive index layer 540 into the second refractive index layer 550, the light is refracted at the refraction inclination surface 540R and may proceed in the front direction. by the refractive index difference between the first refractive index layer 540 and the second refractive index layer 550.

Excluding these differences, the features of the embodiments described with reference to FIG. 1 may all be applied to the embodiments described with reference to FIG. 14, and the duplicate descriptions of the features of the embodiments described in FIG. 1 are omitted.

Figure 15:
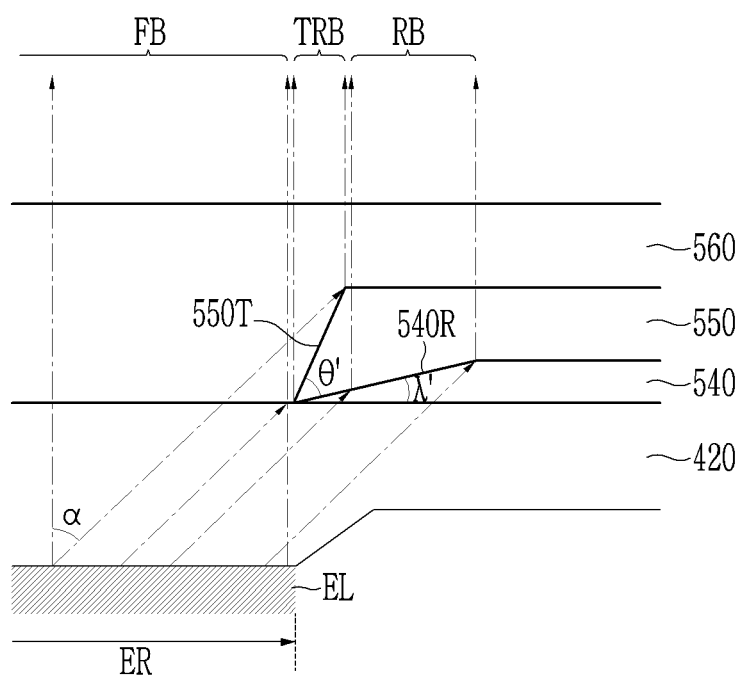
FIG. 15 is a cross-sectional view showing some layers of a display device of FIG. 14.
Figure 16:
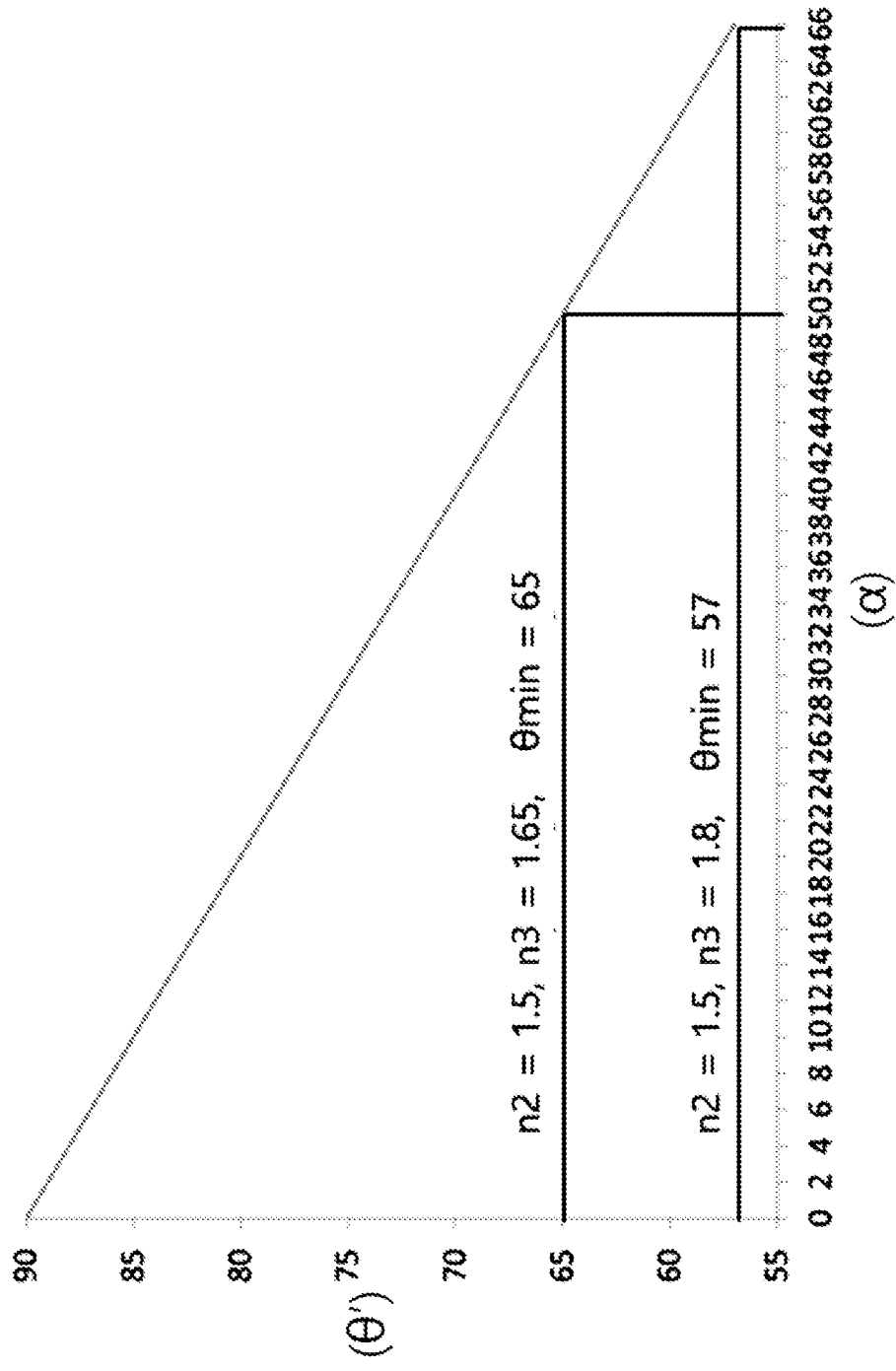
FIG. 16 is a graph showing a relationship of a light emission angle and a total reflection inclination surface for a front light emission according to some embodiments of the present invention.
Figure 17:
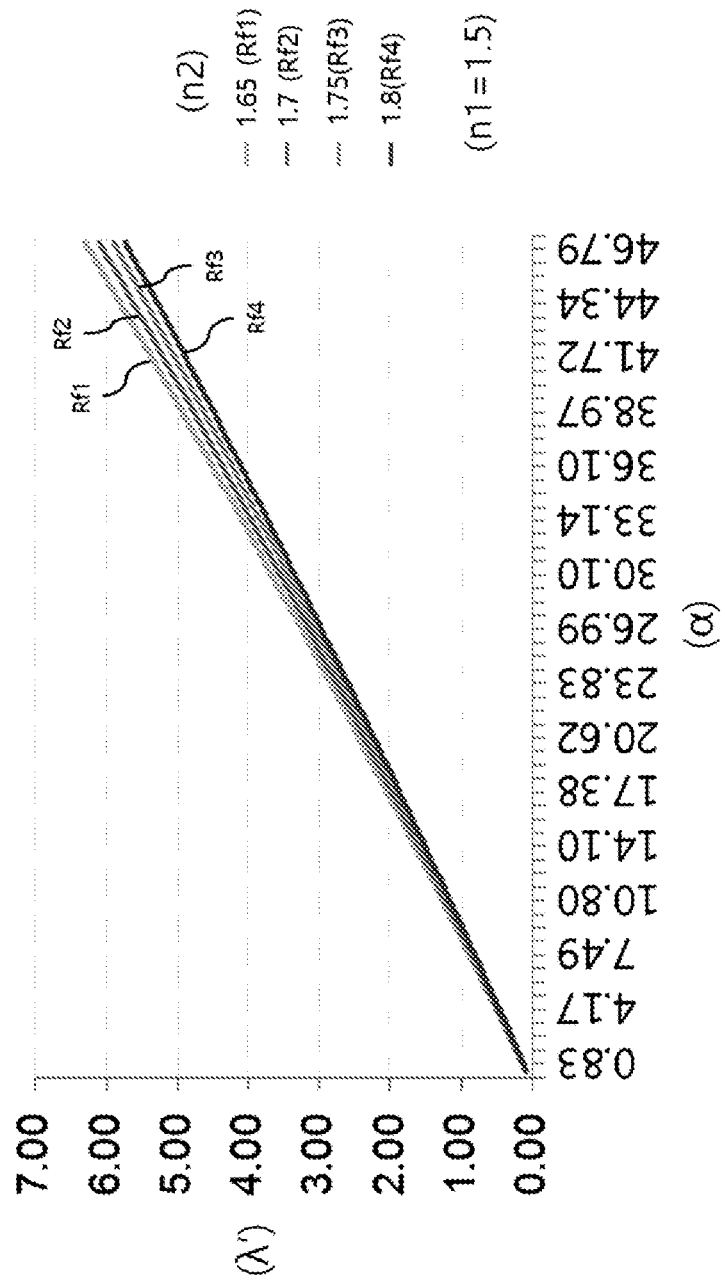
FIG. 17 is a graph showing a relationship of a light emission angle and a refraction inclination surface for a front light emission according to some embodiments of the present invention.

Next, the total reflection inclination angle θ' of the total reflection inclination surface 550T and the refraction inclination angle λ' of the refraction inclination surface 540R is described further in detail with reference to FIG. 15 to FIG. 17.

FIG. 15 is a cross-sectional view showing some layers of a display device of FIG. 14. In FIG. 15, the light-emitting element EL, the planarization layer 420, the first refractive index layer 540, the second refractive index layer 550, and the third refractive index layer 560 are shown, and the light path is shown as an arrow.

Referring to FIG. 15, the light generated from the light-emitting element EL travels in the front direction and may be emitted not only as the front light FB, but also may be obliquely emitted with respect to the front direction. The lateral light obliquely emitted with the light emission angle α (here, 0 degrees<α<90 degrees) with respect to the front direction travels in the front direction through the total reflection from the total reflection inclination surface 550T and may be emitted as the total reflection light TRB. In addition, another part of the lateral light may be refracted at the refraction inclination surface 540R and proceed in the front direction to be emitted as refraction light RB. In this way, the region in which the light is emitted in the front direction in one pixel becomes the region of the front light FB, the total reflection light TRB, and the refraction light RB. That is, the region where the light is emitted by the first to third refractive index layers 540, 550, and 560 in the front direction may be extended by the region of the total reflection light TRB and the refraction light RB, and accordingly, the light emission region efficiency in the front direction may be improved.

Next, the relationship of the refractive index, the light emission angle α, and the total reflection inclination angle θ' of the second refractive index layer 550 and the third refractive index layer 560 is described with reference to FIG. 16.

FIG. 16 is a graph showing a relationship of a light emission angle and a total reflection inclination surface for front light emission according to some embodiments of the present invention.

Referring to FIG. 16, when the refractive index n2 of the second refractive index layer 550 is 1.5 and the refractive index n3 of the third refractive index layer 560 is 1.65, the minimum total reflection inclination angle θmin may be about 65 degrees. In this case, the range of the light emission angle α that may be totally reflected at the total reflection inclination surface 550T may be greater than 0 degrees and 50 degrees or less.

When the refractive index n2 of the second refractive index layer 550 is 1.5 and the refractive index n3 of the third refractive index layer 560 is 1.8, the minimum total reflection inclination angle θmin may be 57 degrees. In this case, the range of the light emission angle α that may be totally reflected from the total reflection inclination surface 550T may be greater than 0 degrees and 65 degrees or less.

Table 1 shows the minimum total reflection inclination angle θmin according to the refractive index n3 of the third refractive index layer 560 when the refractive index n2 of the second refractive index layer 550 is 1.5.

TABLE 1

| n3 | 1.65 | 1.7 | 1.75 | 1.8 |
| --- | --- | --- | --- | --- |
| θ min | 65 | 62 | 59.5 | 57 |

Table 2 shows an example of the light emission angle α according to the refractive index n3 and the total reflection inclination angle θ' of the third refractive index layer 560 when the refractive index n2 of the second refractive index layer 550 is 1.5.

TABLE 2

| n3 | 1.65 | 1.7 | 1.75 | 1.8 |
|---|---|---|---|---|
| θ' 85 | 9.16 | 9.44 | 9.72 | 10 |
| 75 | 27.28 | 28.18 | 29.09 | 30 |
| 70 | 36.10 | 37.38 | 38.68 | 40 |
| 65 | 44.60 | 46.34 | 48.14 | 50 |

As above-described, the total reflection inclination angle θ' may be determined as a range that is smaller than 90 degrees and 50 degrees or more.

Next, the relationship of the refractive index, the light emission angle α, and the refraction inclination angle λ' of the first refractive index layer 540 and the second refractive index layer 550 is described with reference to FIG. 17.

FIG. 17 is a graph showing a relationship of a light emission angle and a refraction inclination surface for front light emission according to some embodiments of the present invention.

Referring to FIG. 17, when the refractive index n1 of the first refractive index layer 540 is 1.5, in a case in which the refractive index n2 of the second refractive index layer 550 is 1.65, 1.7, 1.75, and 1.8, graphs Rf1, Rf2, Rf3, and Rf4 that are determined with the relationship of the refraction inclination angle λ' for the light emission angle α are shown.

The refraction inclination angle λ' of the refraction inclination surface 540R to refract the incident light in the front direction may be determined according to Equation 2.

$$\tan\lambda' = \frac{\sin\alpha}{(n2/n1) - \cos\alpha} \qquad \text{Equation 2}$$

Here, λ' is a refraction inclination angle, α is a light emission angle, n1 is a refractive index of a first refractive index layer 540, and n2 is a refractive index of a second refractive index layer 550.

By Equation 2, when the refractive index n1 of the first refractive index layer 540 is 1.5 and the refractive index n2 of the second refractive index layer 550 is 1.65, the relationship graph Rf1 of the refraction inclination angle λ' for the light emission angle α may be calculated.

Likewise, when the refractive index n1 of the first refractive index layer 540 is 1.5 and the refractive index n2 of the second refractive index layer 550 is 1.7, the relationship graph Rf2 of the refraction inclination angle λ' for the light emission angle α may be calculated. When the refractive index n1 of the first refractive index layer 540 is 1.5 and the refractive index n2 of the second refractive index layer 550 is 1.75, the relationship graph Rf3 of the refraction inclination angle λ' for the light emission angle α may be calculated. When the refractive index n1 of the first refractive index layer 540 is 1.5 and the refractive index n2 of the second refractive index layer 550 is 1.8, the relationship graph Rf4 of the refraction inclination angle λ' for the light emission angle α may be calculated.

The refraction inclination angle λ' may be determined as a range that is larger than 0 degrees and 10 degrees or less.

Hereinafter, embodiments in which some configurations of the display device of FIG. 14 are different is described with reference to FIG. 18 and FIG. 19. The explanation is based on differences compared with FIG. 14.

Figure 18:
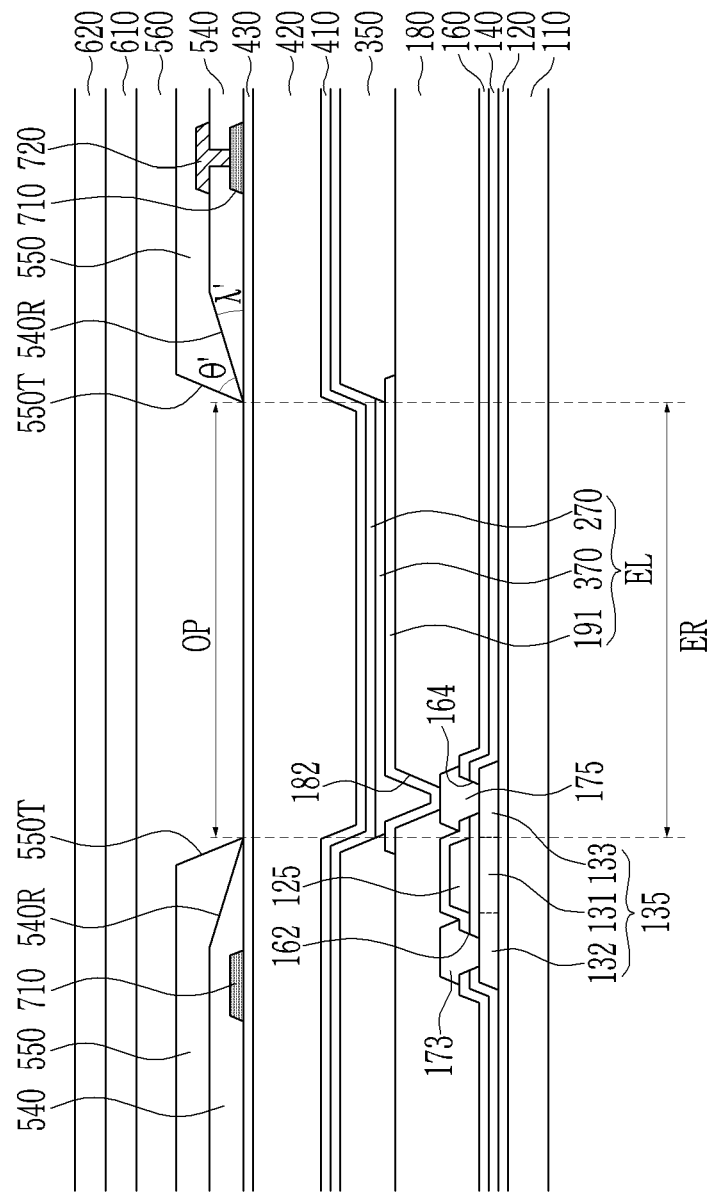
FIG. 18 is a cross-sectional view of a display device differentiating some configurations from a display device of FIG. 14 according to some embodiments.

FIG. 18 is a cross-sectional view of a display device differentiating some configurations from a display device of FIG. 14.

Referring to FIG. 18, the touch electrodes 710 and 720 for detecting the touch may be disposed in a region overlapping the pixel definition layer 350. The first touch electrode 710 may be disposed between the planarization layer 420 and the first refractive index layer 540, and the second touch electrode 720 may be disposed between the first refractive index layer 540 and the second refractive index layer 550. The first touch electrode 710 may include a plurality of transmitting electrodes for transmitting the touch signal for the touch sensing and a plurality of receiving electrodes for forming the capacitance with the transmitting electrodes. The second touch electrode 720 may be a bridge electrode connecting a plurality of transmitting electrodes to each other or a plurality of receiving electrodes to each other through a contact hole formed in the first refractive index layer 540.

Excluding these differences, the features of the embodiments described with reference to to FIG. 14 may all be applied to the embodiments described with reference to FIG. 18, and some duplicate descriptions of the features of the embodiments described in FIG. 14 may be omitted.

Figure 19:
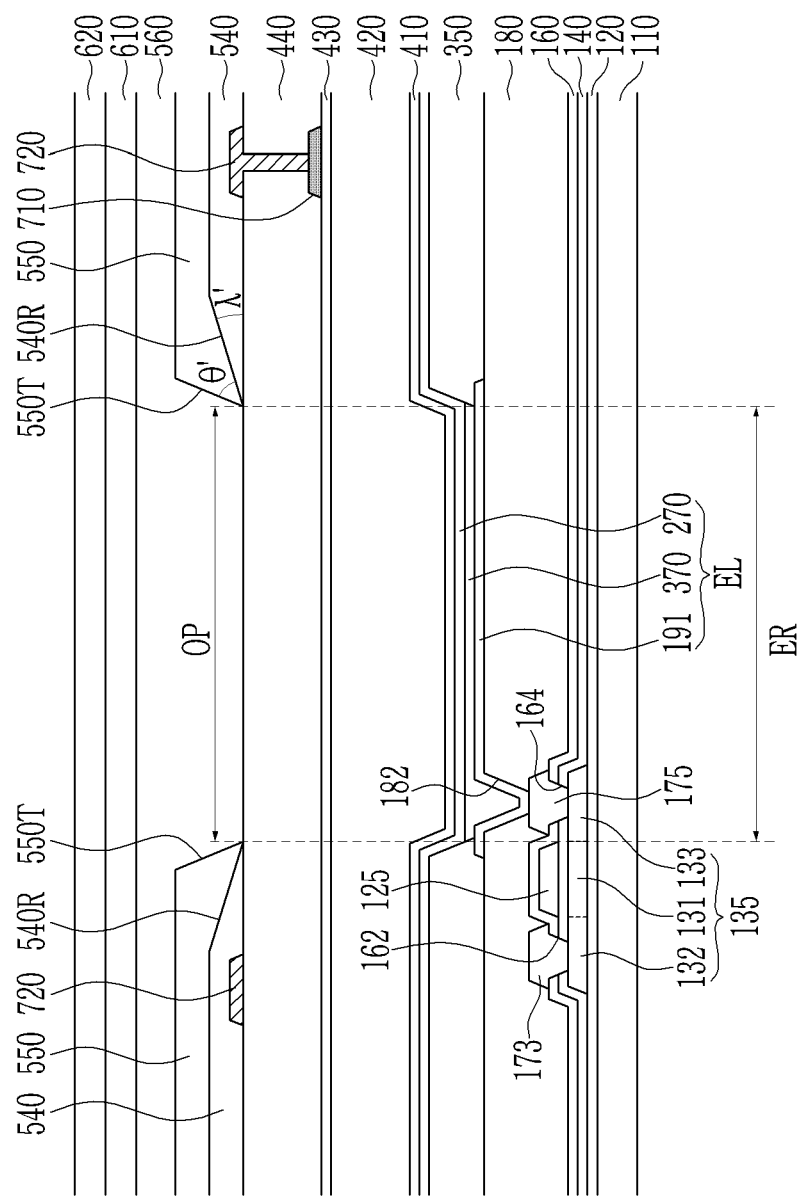
FIG. 19 is a cross-sectional view of a display device differentiating some configurations from a display device of FIG. 14 according to some embodiments.

FIG. 19 is a cross-sectional view of a display device differentiating some configurations from a display device of FIG. 14.

Referring to FIG. 19, a touch insulating layer 440 may be disposed between the planarization layer 420 and the first refractive index layer 540. The touch insulating layer 440 may be disposed on the second buffer layer 430.

The touch electrodes 710 and 720 for detecting the touch may be disposed in a region overlapping the pixel definition layer 350. The first touch electrode 710 may be disposed between the planarization layer 420 and the touch insulating layer 440, and the second touch electrode 720 may be disposed between the touch insulating layer 440 and the first refractive index layer 540. The second touch electrode 720 may include a plurality of transmitting electrodes for transmitting the touch signal for the touch sensing and a plurality of receiving electrodes for forming the capacitance with the transmitting electrode. The first touch electrode 710 may be a bridge electrode that connects a plurality of transmitting electrodes to each other or a plurality of receiving electrodes to each other through a contact hole formed in the touch insulating layer 440.

Excluding these differences, the features of the embodiments described with reference to FIG. 14 may all be applied to the embodiments described with reference to FIG. 19, and some duplicate descriptions of the features of the embodiments described in FIG. 14 may be omitted.

Hereinafter, a form in which a plurality of pixels included in the display device are disposed on a plane is described with reference to FIG. 20 to FIG. 22. The explanation is focused on differences compared with the embodiments of FIG. 11 to FIG. 13.

Figure 20:
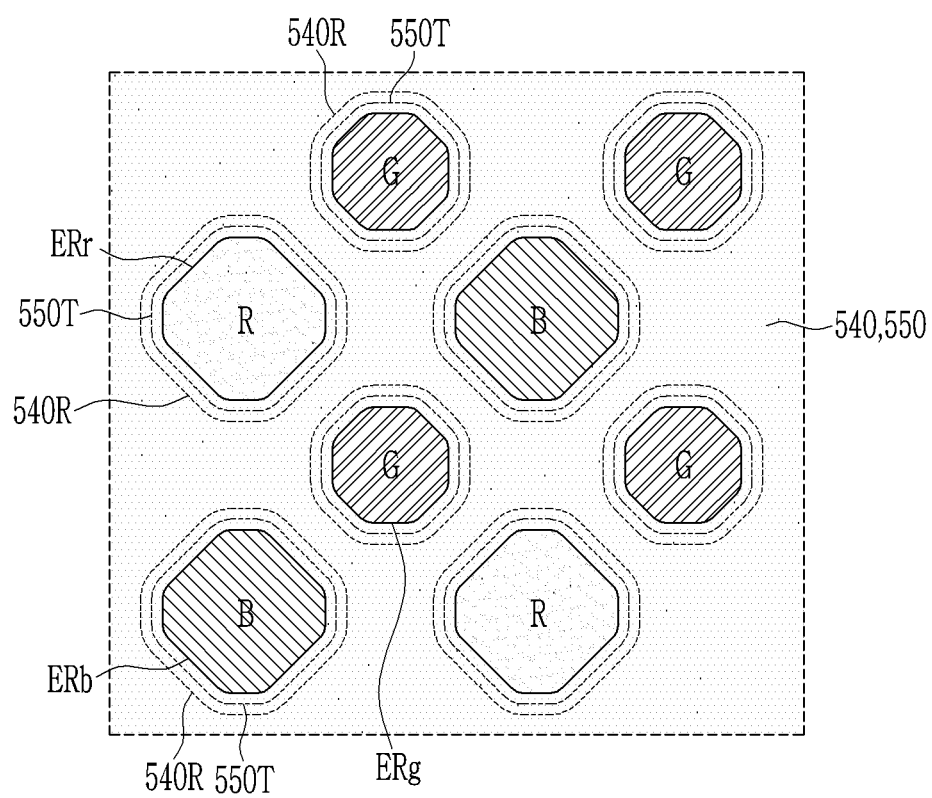
FIG. 20 to FIG. 22 are top plan views showing various arrangement shapes of a plurality of pixels included in a display device according to some embodiments of the present invention.
Figure 21:
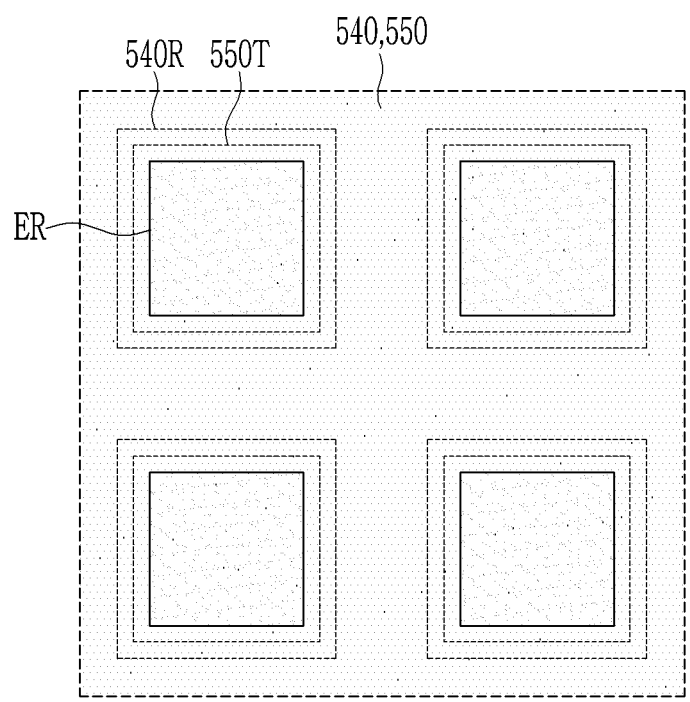
Figure 22:
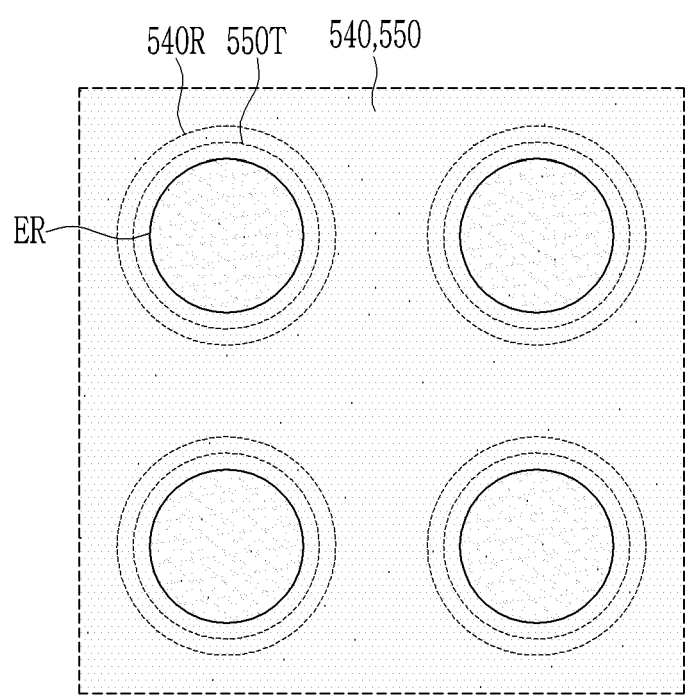

FIG. 20 to FIG. 22 are top plan views showing various arrangement shapes of a plurality of pixels included in a display device according to some embodiments of the present invention.

As shown in FIG. 20, a plurality of pixels may be arranged in the form of a pentile. The first refractive index layer 540 and the second refractive index layer 550 are disposed around the red light emission region ERr, the green light emission region ERg, and the blue light emission region ERb. The total reflection inclination surface 550T of the second refractive index layer 550 may form a ring shape surrounding each of the red light emission region ERr, the green light emission region ERg, and the blue light emission region ERb. The refraction inclination surface 540R of the first refractive index layer 540 may form a ring shape surrounding each of the red light emission region ERr, the green light emission region ERg, and the blue light emission region ERb. On a plane, the refraction inclination surface 540R may be formed from the light emission regions ERr, Erg, and ERb to a wider region than the total reflection inclination surface 550T.

As shown in FIG. 21, a plurality of pixels are arranged in a matrix form and the light emission region ER is formed in a quadrangle, or as shown in FIG. 22, a plurality of pixels may be arranged in a matrix form and the light emission region ER may be formed in a circular shape. Even in this case, the first refractive index layer 540 and the second refractive index layer 550 are disposed around the light emission region ER, and the total reflection inclination surface 550T of the second refractive index layer 550 and the refraction inclination surface 540R of the first refractive index layer 540 may form a ring surrounding the light emission region ER. On a plane, the refraction inclination surface 540R may be formed from the light emission region ER to a wider region than the total reflection inclination surface 550T.

The drawings and the detailed description described above are examples for the present invention and are provided to explain the present invention, and the scope of the present invention described in the claims is not limited thereto. Therefore, it will be appreciated to those skilled in the art that various modifications may be made and other equivalent embodiments are available. Accordingly, the actual scope of the present invention must be determined by the spirit of the appended claims and their equivalents.

DESCRIPTION OF SOME OF THE REFERENCE SYMBOLS

110: substrate
350: pixel definition layer
420: planarization layer
510, 540: first refractive index layer
520, 550: second refractive index layer
530, 560: third refractive index layer

The invention claimed is:

1. A display device comprising:
a substrate;
a light-emitting element on the substrate;
a planarization layer on the light-emitting element;
a first refractive index layer outside a light emission region of the light-emitting element on the planarization layer and including a total reflection inclination surface totally reflecting light emitted from the light-emitting element in a front direction and a refraction inclination surface refracting light emitted from the light-emitting element in the front direction;
a second refractive index layer outside the light emission region of the light-emitting element, wherein the second refractive index layer is adjacent to and extends over a portion of the first refractive index layer to be in contact with the refraction inclination surface and having a smaller refractive index than a refractive index of the first refractive index layer; and
a third refractive index layer on the first refractive index layer and the second refractive index layer to be in contact with the total reflection inclination surface and having a larger refractive index than the refractive index of the first refractive index layer.

2. The display device of claim 1, wherein a refractive index difference between the first refractive index layer and the second refractive index layer is 0.05 or more.

3. The display device of claim 1, wherein a refractive index difference between the first refractive index layer and the third refractive index layer is 0.05 or more.

4. The display device of claim 1, wherein
a thickness of the second refractive index layer is greater than or equal to a thickness of the first refractive index layer.

5. The display device of claim 1, wherein a refraction inclination angle formed by the refraction inclination surface with an upper surface of the substrate is less than 90 degrees and 50 degrees or more.

6. The display device of claim 1, wherein the first refractive index layer has a ring shape surrounding a light-emitting region of the light-emitting element on a plane.

7. The display device of claim 6, wherein the total reflection inclination surface is an inner side surface of the ring-shaped first refractive index layer.

8. The display device of claim 6, wherein the refraction inclination surface is an outer side surface of the ring-shaped first refractive index layer.

9. A display device comprising:
a substrate;
a light-emitting element on the substrate;
a planarization layer on the light-emitting element;
a first refractive index layer outside a light emission region of the light-emitting element on the planarization layer and including a refraction inclination surface refracting light emitted from the light-emitting element in a front direction;
a second refractive index layer outside the light emission region of the light-emitting element, wherein the second refractive index layer is adjacent to and extends over a portion of the first refractive index layer to be in contact with the refraction inclination surface and including a total reflection inclination surface totally reflecting light emitted from the light-emitting element in the front direction and having a larger refractive index than a refractive index of the first refractive index layer; and
a third refractive index layer on the second refractive index layer to be in contact with the total reflection inclination surface and having a larger refractive index than the refractive index of the second refractive index layer.

10. The display device of claim 9, wherein a refractive index difference between the first refractive index layer and the second refractive index layer is 0.05 or more.

11. The display device of claim 9, wherein a refractive index difference between the second refractive index layer and the third refractive index layer is 0.05 or more.

12. The display device of claim 9, wherein a refraction inclination angle of the refraction inclination surface formed by an upper surface of the substrate is less than a total reflection inclination angle of the total reflection inclination surface formed by the upper surface of the substrate.

13. The display device of claim 9, wherein
a thickness of the second refractive index layer is greater than or equal to a thickness of the first refractive index layer.

14. The display device of claim 9, further comprising:
a first touch electrode between the planarization layer and the first refractive index layer; and
a second touch electrode between the first refractive index layer and the second refractive index layer.

15. The display device of claim 9, further comprising:
a touch insulating layer between the planarization layer and the first refractive index layer;

a first touch electrode between the planarization layer and the touch insulating layer; and a second touch electrode between the touch insulating layer and the first refractive index layer.

16. A display device comprising:
a substrate;
a light-emitting element on the substrate;
a first refractive index layer comprising:
   a total reflection inclination surface configured to totally reflect light emitted from the light-emitting element in a front direction; and
   a refraction inclination surface configured to refract light emitted from the light-emitting element in the front direction and sloping from a top of the refraction inclination surface, that is a furthest point of the refraction inclination surface along a light emission direction of the light-emitting element, to a bottom of the refraction inclination surface, that is a closest point of the refraction inclination surface along the light emission direction, in a direction away from the light-emitting element, wherein a region wherein a light is emitted in the front direction in one pixel includes a front light region corresponding a light emission region of the light-emitting element, a total reflection light region corresponding to the total reflection inclination surface, and a refraction light region corresponding to the refraction inclination surface, and wherein the refraction inclination surface is an interface between the first refractive index layer having a first refractive index and a second refractive index layer having a second refractive index that is smaller than the first refractive index.

17. The display device of claim 16, wherein
the total reflection inclination surface is an interface between the first refractive index layer and a third refractive index layer having a third refractive index that is larger than the first refractive index.

18. The display device of claim 16, wherein
the first refractive index layer has a ring shape surrounding the light emission region of the light-emitting element on a plane.

* * * * *